(12) United States Patent
Yoneda et al.

(10) Patent No.: US 9,698,307 B2
(45) Date of Patent: Jul. 4, 2017

(54) LIGHT EMITTING DEVICE

(71) Applicant: Nichia Corporation, Anan-shi (JP)

(72) Inventors: Akinori Yoneda, Anan (JP); Yoshiyuki Aihara, Tokushima (JP); Shinji Nakamura, Tokushima (JP); Akiyoshi Kinouchi, Komatsushima (JP); Kazuki Kashimoto, Tokushima (JP); Kazuyuki Akaishi, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/477,617

(22) Filed: Sep. 4, 2014

(65) Prior Publication Data
US 2015/0060934 A1   Mar. 5, 2015

(30) Foreign Application Priority Data

Sep. 5, 2013  (JP) .................. 2013-184220

(51) Int. Cl.
*H01L 33/00* (2010.01)
*H01L 33/38* (2010.01)
(Continued)

(52) U.S. Cl.
CPC .......... *H01L 33/385* (2013.01); *H01L 33/486* (2013.01); *H01L 33/54* (2013.01);
(Continued)

(58) Field of Classification Search
CPC ................................ H01L 33/54; H01L 33/62
(Continued)

(56) References Cited

U.S. PATENT DOCUMENTS

2008/0191327 A1   8/2008  Asakawa et al.
2009/0315049 A1*  12/2009  Urasaki ................. H01L 33/486
                                                                  257/98
(Continued)

FOREIGN PATENT DOCUMENTS

JP       05-299530 A    11/1993
JP    2003-282957 A    10/2003
(Continued)

*Primary Examiner* — Jamie C Niesz
(74) *Attorney, Agent, or Firm* — Foley & Lardner LLP

(57) ABSTRACT

A side-view type light emitting device having a bottom surface thereof as a light emission surface and one side surface thereof as amounting surface for mounting on amounting substrate includes a stacked semiconductor layer having a first semiconductor layer, an active layer, and a second semiconductor layer which are stacked in that order from a side of the bottom surface; a first connecting electrode exposed from the one side surface and electrically connected to the first semiconductor layer; a metal wire having one end thereof electrically connected to an upper surface of the second semiconductor layer; a second connecting electrode exposed from the one side surface and electrically connected to the other end of the metal wire; and a resin layer which covers at least a part of each of the first semiconductor layer, the second semiconductor layer, the first connecting electrode, the second connecting electrode and the metal wire and which is configured to form an upper surface and side surfaces of the light emitting device.

11 Claims, 14 Drawing Sheets

(51) Int. Cl.
*H01L 33/54* (2010.01)
*H01L 33/62* (2010.01)
*H01L 33/48* (2010.01)
*H01L 33/40* (2010.01)

(52) U.S. Cl.
CPC ............ *H01L 33/62* (2013.01); *H01L 33/387* (2013.01); *H01L 33/405* (2013.01)

(58) Field of Classification Search
USPC .................................................. 257/99, 100
See application file for complete search history.

(56) References Cited

U.S. PATENT DOCUMENTS

| 2010/0014279 A1* | 1/2010 | Inoue ................... H01L 33/486 362/97.1 |
| 2010/0148198 A1 | 6/2010 | Sugizaki et al. |
| 2011/0068359 A1 | 3/2011 | Yahata et al. |
| 2011/0089453 A1* | 4/2011 | Min ......................... F21V 5/04 257/98 |
| 2012/0097972 A1 | 4/2012 | Sugizaki et al. |
| 2012/0153340 A1* | 6/2012 | Song .................... G02B 6/4201 257/99 |
| 2013/0285090 A1* | 10/2013 | Furuyama ............ H01L 33/501 257/98 |
| 2014/0175471 A1* | 6/2014 | Akimoto ............... H01L 27/156 257/91 |

FOREIGN PATENT DOCUMENTS

| JP | 2008-198807 A | 8/2008 |
| JP | 2008-251794 A | 10/2008 |
| JP | 2010-141176 A | 6/2010 |
| JP | 2011-066304 A | 3/2011 |
| JP | 2013-089667 A | 5/2013 |

* cited by examiner

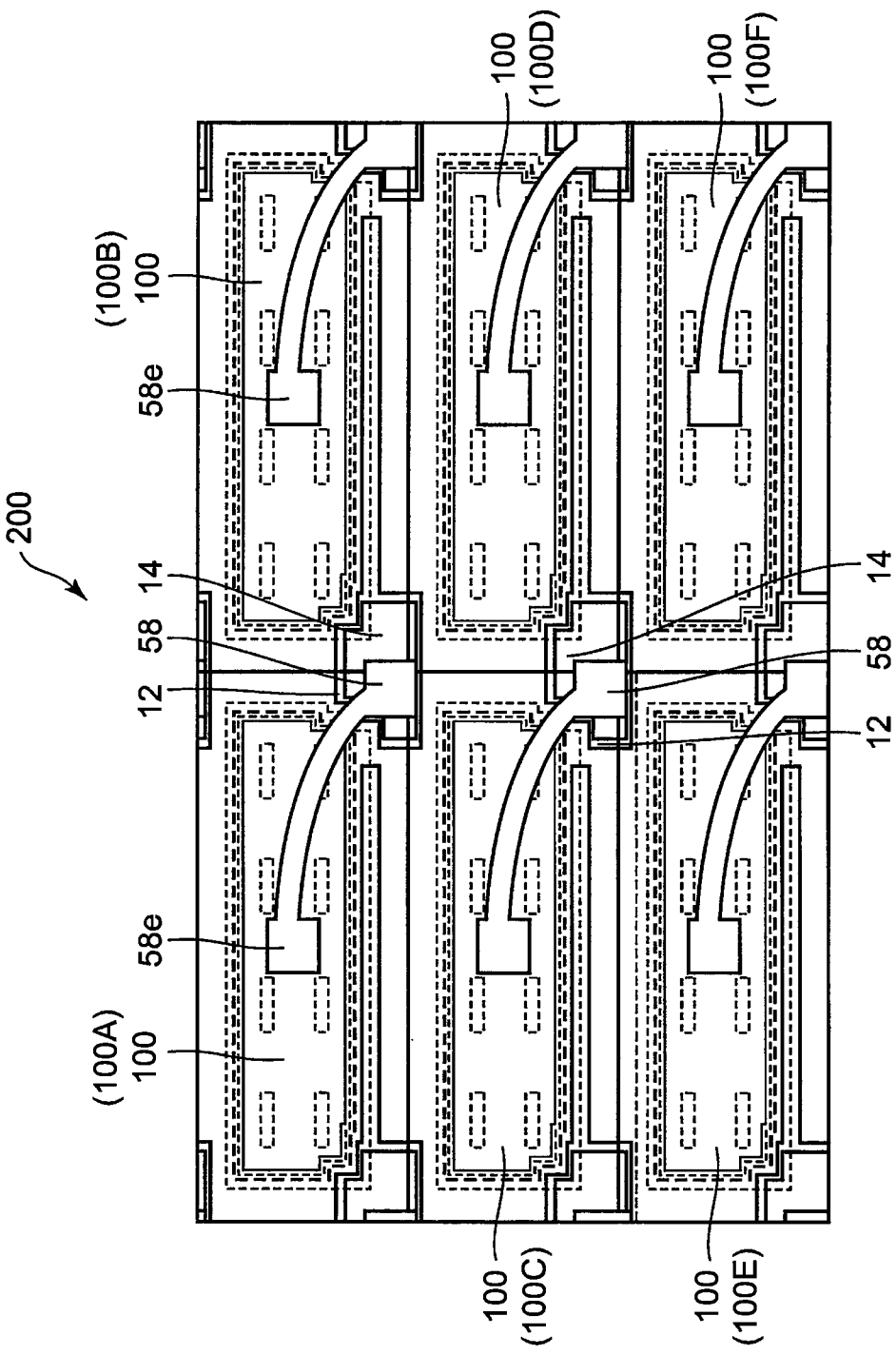

LIGHT EMITTING DEVICE

CROSS REFERENCE TO RELATED PATENT APPLICATION

This application claims priority on Japanese Patent Application No. 2013-184220 filed on Sep. 5, 2013, the disclosure of which is incorporated by reference herein.

BACKGROUND OF THE INVENTION

Field of the Invention

The present disclosure relates to a light emitting device, and more specifically to a side-view type light emitting device that can emit light in a direction substantially parallel to an upper surface of a mounting substrate for mounting the light emitting device.

Description of Related Art

Light emitting devices using a light emitting element, such as a light emitting diode, are easily reduced in size and can have high light emission efficiency.

As one of the light emitting devices using the light emitting element, a side-view type light emitting device is known that can emit light in the direction substantially parallel to an upper surface of a mounting substrate. For example, as disclosed in JP 2008-198807 A, the conventional side-view type light emitting device includes a resin package with a cavity serving as a side surface side opening in a mounted state, and two leads with exposed parts located at the bottom (back) of the cavity and the side surface of the resin package (particularly, side surface serving as a mounting surface). A light emitting element (semiconductor chip) is mounted on one of the two leads. One of p-side and n-side electrodes of the light emitting element is electrically connected to one lead by a metal wire, while the other of the p-side and n-side electrodes of the light emitting element is electrically connected to the other lead by a metal wire.

When mounting the light emitting device with this structure on the mounting substrate, the two leads exposed at the mounting surface are electrically connected to a wiring layer on the mounting substrate by soldering or the like.

In this way, power can be supplied to the light emitting element, so that light emitted from the light emitting element in the cavity goes directly straight or is reflected by a wall surface of the cavity to pass through an opening on the side surface of the resin package in the direction substantially parallel to the upper surface of the mounting substrate. As a result, a sufficient amount of light can be emitted in the direction substantially parallel to the upper surface of the mounting substrate.

Thus, the side-view type light emitting device serves as a compact light source for backlighting that can supply the sufficient amount of light by placing the cavity facing an end surface of a light guide plate of a small or medium-sized liquid crystal display, for example, used in a cellular phone (including a smartphone), a lap-top computer, a tablet and the like. That is, the use of the side-view type light emitting device can provide a compact and/or light-weight liquid crystal display that exhibits high brightness with a little power consumption.

In this way, the thus-obtained side-view type light emitting device can ensure the sufficient brightness with low power consumption, while achieving the reduction in size and/or weight of the device itself. Thus, the side-view type light emitting device can be used in a variety of applications, including various types of meters (or indicators), a read sensor, an illumination lamp and the like, in addition to the liquid crystal display.

Various devices using a side-view type light emitting device, such as a display, are increasingly required to be reduced in size and/or weight.

In particular, the reduction in size (thinning) of the light emitting device in the thickness direction (direction perpendicular to the mounting surface) is profoundly desired, for example, in a display, as it directly leads to thinning of the display. Further, in any application other than the display of various meters, read sensor, and illumination lamp mentioned above, the entire light emitting device can also be thinned, for example, by reducing the thickness of a light guide plate. For this reason, the thinning of the side-view type light emitting device is strongly required.

In the conventional structure, however, as mentioned above, the light emitting element is disposed at the exposed part of the lead positioned at the bottom of the cavity provided in the resin package. For this reason, a certain level of the thickness of the resin package, specifically, an interval between the surface of the resin package and the cavity surface needs to be set adequate for the device. Further, in order to insert the light emitting element into the cavity or the like, some gap (interval) also needs to be ensured between the light emitting element and a wall surface of the cavity (that is, an inner surface of the resin package).

Therefore, there was limitation on thinning of the conventional side-view type light emitting devices.

SUMMARY OF THE INVENTION

Accordingly, it is an object of one aspect of the present invention to provide a side-view type light emitting device that can be further thinned. Further, it is an object of another aspect of the present invention to provide a method for effectively producing a side-view type light emitting device that can be thinned.

According to one aspect of the present invention, there is provided a side-view type light emitting device which has a bottom surface thereof as a light emission surface and one side surface thereof as a mounting surface for mounting on a mounting substrate. The light emitting device comprises a stacked semiconductor layer including a first semiconductor layer, an active layer and a second semiconductor layer which are stacked in that order from a side of the bottom surface; a first connecting electrode exposed from the one side surface and electrically connected to the first semiconductor layer; a metal wire having one end thereof electrically connected to an upper surface of the second semiconductor layer; a second connecting electrode exposed from the one side surface and electrically connected to the other end of the metal wire; and a resin layer covering at least a part of each of the first semiconductor layer, the second semiconductor layer, the first connecting electrode, the second connecting electrode and the metal wire, and being configured to form an upper surface and side surfaces of the light emitting device.

The light emitting device according to one aspect of the present invention has a structure capable of being thinned. According to another aspect of the present invention, there is provided a method for effectively producing a light emitting device with a structure capable of being thinned.

BRIEF DESCRIPTION OF THE DRAWINGS

FIG. 4 is a top view of a light emitting device assembly 200 including a plurality of light emitting devices 100 connected together over a substrate 2.

DETAILED DESCRIPTION OF THE PREFERRED EMBODIMENTS

Figure 1:
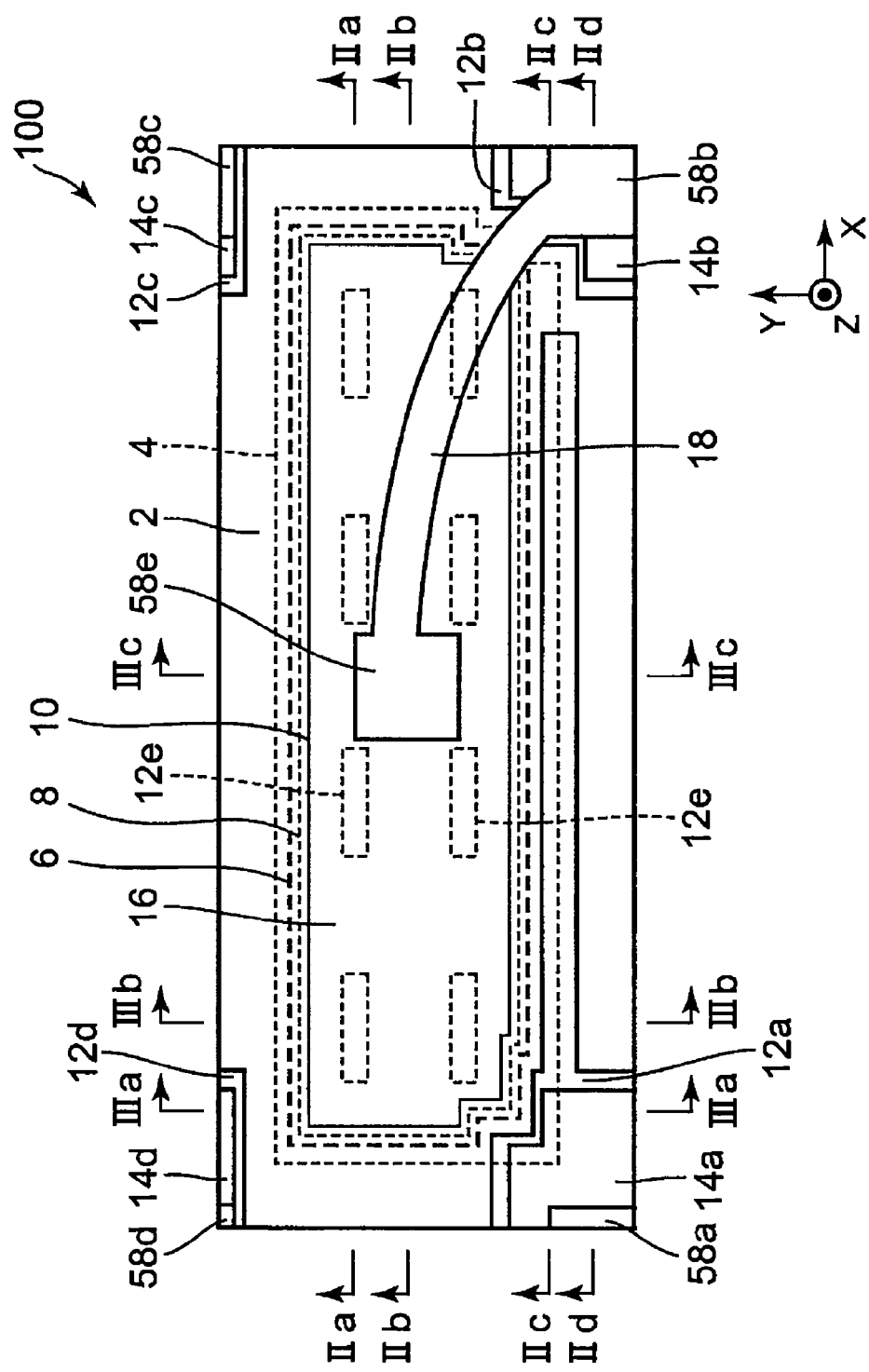
FIG. 1 is a schematic plan view showing a light emitting device 100 according to one embodiment of the present invention.

Preferred embodiments of the present invention will be described in detail below with reference to the accompanying drawings. In the description below, the terms indicative of the specific direction or position (for example, "upper", "lower", "right", "left", and other words including these words) are used if necessary, for better understanding of embodiments of the present invention with reference to the drawings. The meanings of the terms do not limit the scope of the present invention. The same parts or members are designated by the same reference numerals throughout the drawings.

The inventors have been dedicated themselves to studies of a side-view type light emitting device with a bottom surface thereof as a light emission surface and one side surface thereof as a mounting surface for mounting the device on a mounting substrate (that is, a light emitting device that is mounted on the mounting substrate in use with the mounting surface positioned substantially in parallel to an upper surface of the mounting substrate, and with the bottom surface as the light emission surface positioned, for example, in the direction substantially perpendicular to the upper surface of the mounting substrate, thereby allowing a large amount of light emitted from the emission surface to travel in the direction substantially parallel to the upper surface of the mounting substrate). As a result, the inventors have found that the side-view type light emitting device with the following structure can be thinned.

The light emitting device of this embodiment includes two connecting electrodes exposed from the mounting surface, namely, a first connecting electrode and a second connecting electrode. The light emitting device also includes two semiconductor layers stacked from the bottom surface (light emission surface) side in that order to emit the light from therebetween. These semiconductor layers area first semiconductor layer which is one of p-type and n-type semiconductor layers, and a second semiconductor layer which is the other one of the p-type and n-type semiconductor layers. The first layer and the second layer are tacked from the bottom surface (light emission surface) side in that order to emit the light from therebetween. The power (current) is supplied to the first and second semiconductor layers by using the first and second connecting electrodes.

The first connecting electrode is directly in contact with the first semiconductor layer, or is electrically connected to a first semiconductor layer electrode that is electrically connected to the first semiconductor layer, whereby the first connecting electrode is electrically connected to the first semiconductor layer.

The second connecting electrode is formed of a metal wire, whose one end is electrically connected to an electrode that is electrically connected to the upper surface of the second semiconductor layer, whereby the second connecting electrode is electrically connected to the second semiconductor layer.

The light emitting device of this embodiment includes a resin layer covering at least a part of each of the first semiconductor layer, the second semiconductor layer, the first connecting electrode, the second connecting electrode and the metal wire. The resin layer is configured to form the upper and side surfaces of the light emitting device.

A light emitting device according to another embodiment includes a plurality of metal wires 18. The first metal wire 18 has one end thereof wire-bonded to an upper surface of a reflective film 16 to form a bonding portion 58e, and the other end thereof wire-bonded to an upper surface of a p-side connecting electrode 14b to form a bonding portion 58b. Another metal wire (second metal wire) has at least one end wire-bonded to an upper surface of an n-side connecting electrode 14a to form a bonding portion 58a.

The light emitting device with such a structure in this embodiment does not need leads over which a semiconductor chip is to be mounted, unlike the conventional side-view type light emitting device.

The light emitting device of this embodiment uses the resin layer that covers at least a part of each of the first semiconductor layer, the second semiconductor layer, the first connecting electrode, the second connecting electrode and the metal wire so that the resin layer forms the upper and side surfaces of the light emitting device. Thus, the light emitting device of this embodiment does not need to make a gap for insertion of the light emitting element between the semiconductor chip (for example, first and second semiconductor layers) and the resin layer, unlike the conventional side-view type light emitting device that uses a resin package with a cavity formed therein to insert a light emitting element (semiconductor chip) into a bottom part of the cavity.

For this reason, the light emitting device in one embodiment of the present invention can be reduced in size, especially, in size in the thickness direction of the light emitting device (which is the direction perpendicular to the mounting surface).

A method for producing a light emitting device according to one embodiment of the present invention includes the steps of forming a light emitting device assembly with a plurality of light emitting devices arranged (or aligned) and coupled together, and then dividing (singulating) the light emitting device assembly into the individual light emitting devices, which as a result produces the desired light emitting devices.

In the step of forming the light emitting device assembly, more specifically, when forming a first connecting electrode and a second connecting electrode for the individual light emitting devices, the first connecting electrode in one of two adjacent light emitting devices is integrally formed with the second connecting electrode in the other light emitting device.

Thus, this method can more effectively produce the light emitting device.

The details of the light emitting device according to this embodiment will be described in detail below with reference to the accompanying drawings.

1. Light Emitting Device 100

FIG. 1 shows a schematic plan view of a light emitting device 100 according to one embodiment of the present invention.

Figure 2A:
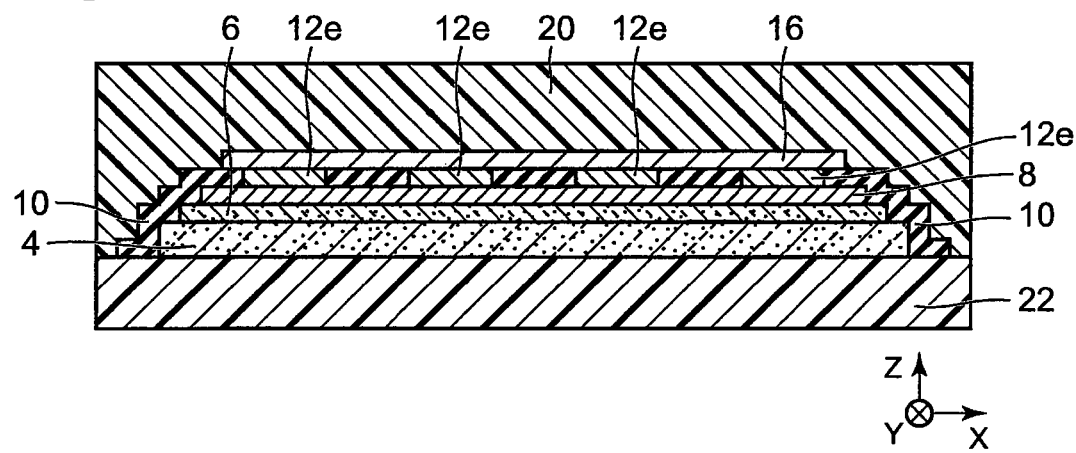
FIG. 2A is a schematic cross-sectional view taken along line IIa-IIa of FIG. 1.
Figure 2B:
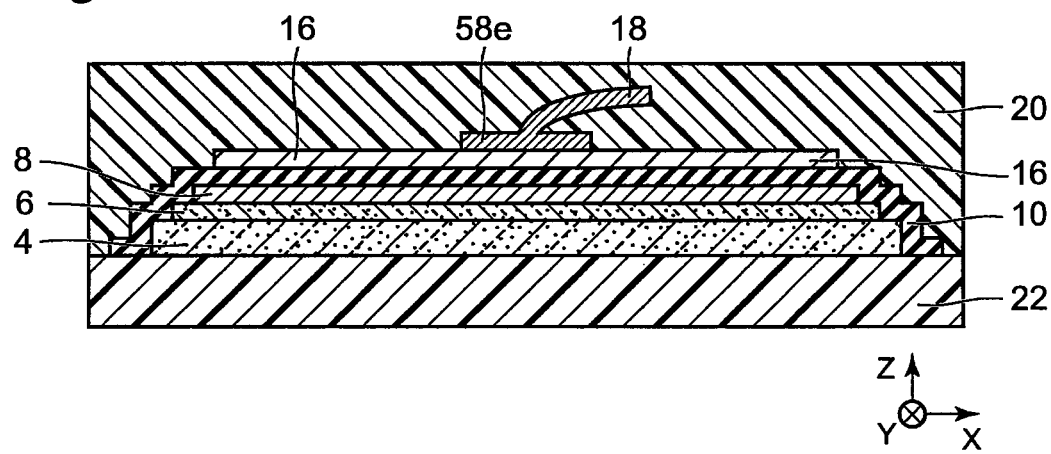
FIG. 2B is a schematic cross-sectional view taken along line IIb-IIb of FIG. 1.
Figure 2C:
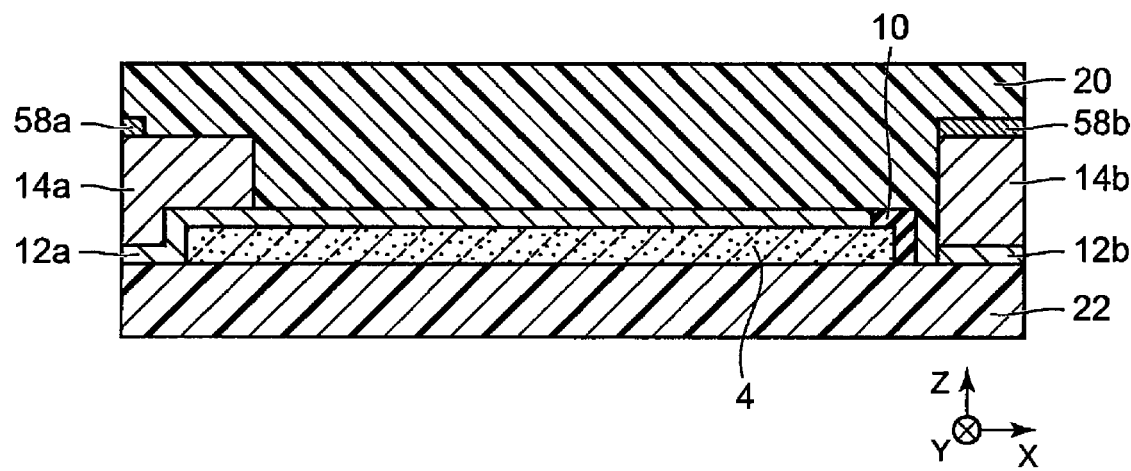
FIG. 2C is a schematic cross-sectional view taken along line IIc-IIc of FIG. 1.
Figure 2D:
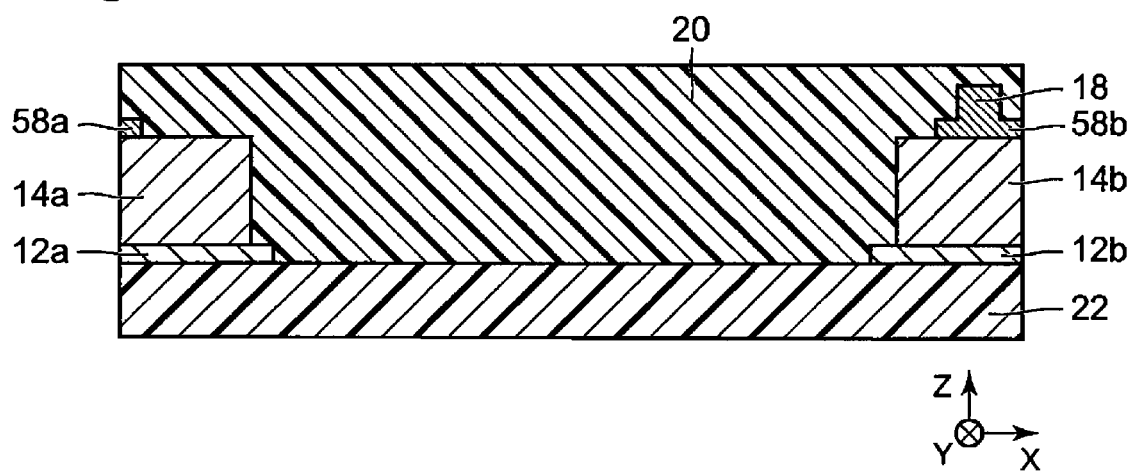
FIG. 2D is a schematic cross-sectional view taken along line IId-IId of FIG. 1.

FIG. 2A is a schematic cross-sectional view taken along line IIa-IIa of FIG. 1. FIG. 2B is a schematic cross-sectional view taken along line IIb-IIb of FIG. 1. FIG. 2C is a schematic cross-sectional view taken along line IIc-IIc of FIG. 1. FIG. 2D is a schematic cross-sectional view taken along line IId-IId of FIG. 1.

Figure 3A:
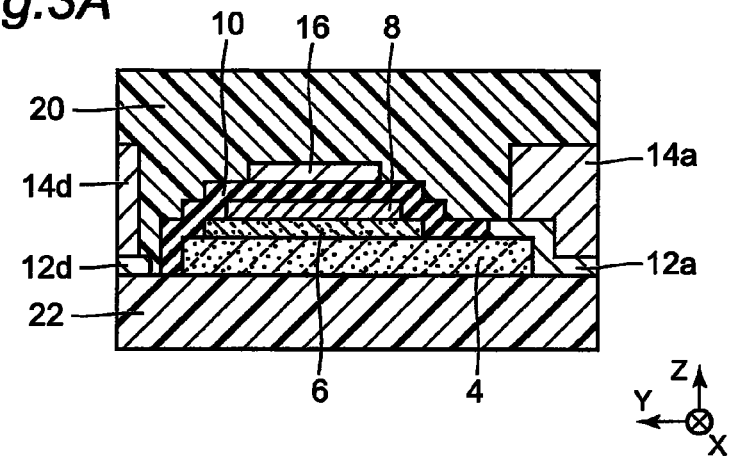
FIG. 3A is a schematic cross-sectional view taken along line IIIa-IIIa of FIG. 1.
Figure 3B:
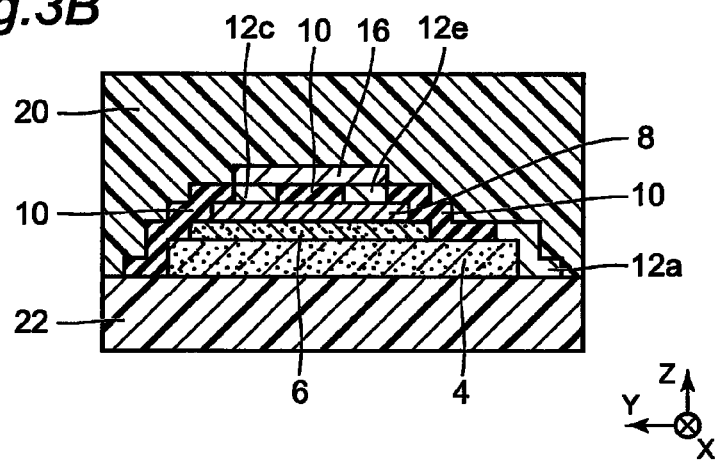
FIG. 3B is a schematic cross-sectional view taken along line IIIb-IIIb of FIG. 1.
Figure 3C:
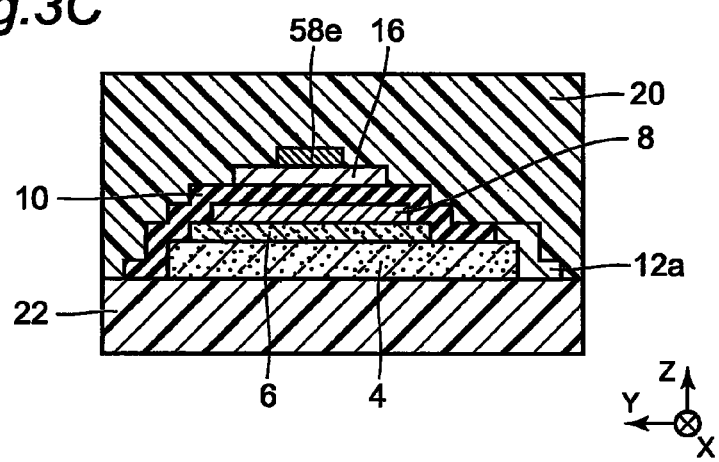
FIG. 3C is a schematic cross-sectional view taken along line IIIc-IIIc of FIG. 1.

FIG. 3A is a schematic cross-sectional view taken along line IIIa-IIIa of FIG. 1. FIG. 3B is a schematic cross-sectional view taken along line IIIb-IIIb of FIG. 1. FIG. 3C is a schematic cross-sectional view taken along line IIIc-IIIc of FIG. 1.

The illustration of a resin layer 20 is omitted from FIG. 1 in order to clarify the arrangement of components of a semiconductor 100, including a metal wire 18 and the like.

In the specification, like FIGS. 2A to 2D, the drawings designated by the same number followed by a different alphabet are collectively indicated only by the number, for example, "FIG. 2", in some cases.

As will be mentioned in detail later, in one embodiment of the present invention, after semiconductor layers 4 and 6, resin layer 20, and the like are formed over the substrate 2, the substrate 2 may be removed. Alternatively, after the substrate 2 is removed, a phosphor layer 22 may be formed in a position where the substrate 2 used to exist.

Referring to FIG. 1, the substrate 2 stays remained to make it easier to compare with a light emitting assembly 200 shown in FIG. 4, which will be used later for the explanation of a production method. In contrast, referring to FIGS. 2 and 3, the substrate 2 is removed and, the phosphor layer 22 is provided instead.

In the light emitting device 100 mentioned below, the structure with the phosphor layer 22 will be mainly described. It is noted that the substrate 2 of FIG. 1 can be read instead of the phosphor layer 22.

The light emitting device 100 includes an n-type semiconductor layer (first semiconductor layer) 4 disposed on the phosphor layer 22 or substrate 2, a p-type semiconductor layer (second semiconductor layer) 6 disposed on the n-type semiconductor layer 4, a full-scale electrode 8 disposed in contact with an upper surface of the p-type semiconductor layer 6 to cover the substantially entire surface of the upper surface thereof, and a p-side electrode 12e disposed over parts of the full-scale electrode 8 in contact with the full-scale electrode 8.

A plurality of p-side electrodes 12e is preferably disposed to allow current to relatively uniformly flow through the entire p-type semiconductor layer 6 via the full-scale electrode 8 (in the embodiment shown in FIG. 1, eight p-type electrodes are disposed on the full-scale electrode 8).

Preferably, as shown in FIG. 1, the n-type semiconductor layer 4 is not formed at the outer periphery (a part or the whole of the outer periphery) of the upper surface of the phosphor layer 22 or substrate 2. This is because the resin layer 20, n-side connecting electrode 14a and p-side connecting electrode 14b to be mentioned later can be disposed at the outer periphery of the upper surface of the phosphor layer 22 or substrate 2.

A protective film 10 is formed of insulating material to cover the n-type semiconductor layer 4, p-type semiconductor layer 6 and full-scale electrode 8.

In the embodiment shown in FIGS. 1 to 3, the protective film 10 are in contact with at least parts of both the side surface and upper surface of each of the n-type semiconductor layer 4, p-type semiconductor layer 6 and full-scale electrode 8. Apart of the upper surface of the full-scale electrode 8 not provided with the p-side electrode 12e is covered with the protective film 10 (see FIGS. 2B and 3B).

The reflective film 16 is provided on the p-side electrode 12e to cover the substantially upper surface of the full-scale electrode 8 so as to be in contact with the p-side electrode 12e (see FIGS. 2A, 2B, and 3). The reflective film 16 is adapted to reflect light entering from a lower part thereof (in the direction −Z of FIGS. 1 to 3). The reflective film 16 has electrical conductivity, and may be formed of metal, for example, aluminum or the like. In order to improve the reflection properties of the reflective film 16, the reflective film 16 can have at least a part thereof formed using DBR (Distributed Bragg Reflector). The reflective film 16 can also serve as an electrode.

The resin layer 20 to be mentioned later can have a high reflectivity by being formed of, for example, white resin. Thus, the presence of the reflective film 16 is preferable because of its high reflectivity. However, the reflective film 16 may be omitted as appropriate due to reasons, such as cost.

An n-side electrode 12a is disposed in contact with the n-type semiconductor layer 4. In the embodiment shown in FIGS. 1 to 3, the n-side electrode 12a is in contact with a lower part (in the direction −Y of FIGS. 1 to 3) of the upper surface of the n-type semiconductor layer 4 where the p-type semiconductor layer 6 is not formed, and the side surface of the n-type semiconductor layer 4 (side surface on the lower side of FIG. 1 (in the direction −Y) of two side surfaces parallel to the surface Z-X in FIGS. 1 to 3).

In this case, as show in FIG. 3C, the n-side electrode 12a preferably extends over the n-type semiconductor layer 4 by a length such as one fourth of the length of the n-type semiconductor (the length in the direction X of FIG. 2). The n-side electrode with such a structure can increase the light flux.

On the other hand, the n-side electrode 12*a* can also have the structure covering the outer periphery of the n-type semiconductor layer 4. This arrangement can improve the Vf and linearity.

The electric connection between the n-side electrode 12*a* and n-type semiconductor layer 4 is not limited to the embodiments mentioned above. Alternatively, the n-type semiconductor layer 4 may be electrically connected in any form, including the formation of the n-type semiconductor layer 4 over the whole region or a part thereof between the phosphor layer 22 and the n-side electrode 12*a*. Thus, a sapphire substrate serving as a substrate for growth of the semiconductor layer can be easily peeled off. In the embodiment shown in FIGS. 1 to 3, the n-side electrode 12*a* includes a part in contact with the phosphor layer 22, a part in contact with the side surface of the n-type semiconductor layer 4, and a part in contact with the upper surface of the n-side semiconductor layer 4. Instead of this, the n-side electrode 12*a* may include only a part in contact with the phosphor layer 22 and a part in contact with the side surface of the n-type semiconductor layer 4.

The p-side full-scale electrode 8 needs to be separated from the n-type semiconductor layer 4. The reason for this is to prevent the occurrence of short circuit within the light emitting device 100. The p-side full-scale electrode 8 is preferably isolated from the exposed side surface of the n-type semiconductor layer 4 from the viewpoint of the production of the light emitting device. The isolation means acts, for example, to isolate the p-side full-scale electrode 8 from the n-type semiconductor layer 4 via an insulating film.

The light emitting device 100 is adapted to emit light between the p-type semiconductor layer 6 and the n-type semiconductor layer 4 by allowing current to flow through between the p-type semiconductor layer 6 and the n-type semiconductor layer 4. In order to obtain the higher light emission efficiency, a light emission layer (active layer) is provided by stacking semiconductor layers between the p-type semiconductor layer 6 and the n-type semiconductor layer 4.

As mentioned above, the p-type semiconductor layer 6 is electrically connected to the reflective film 16 via the full-scale electrode 8 and the p-side electrode 12*e*.

On the other hand, the n-type semiconductor layer 4 is electrically connected to the n-side electrode 12*a*.

In the embodiment shown in FIG. 1, the substrate 2 for growing the n-type semiconductor 4, for example, a sapphire substrate or the like, remains as it is. In this case, the bottom surface serving as the light emission surface of the light emitting device 100 (surface positioned in the direction −Z of two surfaces parallel to the Y-X surface in FIGS. 1 to 3) is constructed of the substrate 2.

In the embodiment shown in FIGS. 2 and 3, the phosphor layer 22 is disposed in place of the substrate 2 at the bottom surface of the light emitting device 100. In this case, the bottom surface of the light emitting device 100 serving as the light emission surface is constructed of the phosphor layer 22.

After removing the substrate 2, the phosphor layer 22 is formed. The phosphor layer 22 contains phosphor material that absorbs a part of light emitted from the active layer between the p-type layer 6 and n-type semiconductor layer 4 to emit another light with a longer wavelength.

When the phosphor layer 22 is provided, the lower surface of the n-type semiconductor layer 4 in contact with the phosphor layer 22 preferably has an uneven surface by being roughened. This is because the light is scattered by the uneven surface, which can reduce the total reflection caused at an interface between the n-type semiconductor layer 4 and the phosphor layer 22, thereby enhancing the light emission efficiency (particularly, light extraction efficiency).

Instead of providing the phosphor layer 22 after removing the substrate 2, the phosphor layer 22 may be provided under the substrate 2 (in the direction −Z of FIGS. 1 to 3).

A description will be made of the structure of the light emitting device 100 that respectively supplies electric power (current) from an external element, such as a wiring layer disposed at the mounting substrate, to the p-type semiconductor layer 6 and n-type semiconductor layer 4. The n-side connecting electrode (first connecting electrode) 14*a* and the p-side connecting electrode (second connecting electrode) 14*b* are disposed to be exposed from the mounting surface which is one of the side surfaces of the light emitting device 100 (side surface positioned in the direction −Y of the two side surfaces parallel to the surface Z-X as shown in FIGS. 1 to 3).

The n-side connecting electrode 14*a* and p-side connecting electrode 14*b* are respectively connected to external wirings, such as the wiring layer of the mounting substrate, via soldering or the like.

Preferably, the n-side connecting electrode 14*a* and p-side connecting electrode 14*b* are respectively positioned at different ends in the lateral direction of the mounting surface.

FIG. 2D is a schematic cross-sectional view taken along line IId-IId of FIG. 1 as mentioned above, and conforms to a side-view type obtained by viewing the mounting surface of the preferred embodiment from the direction perpendicular thereto. Specifically, the n-side connecting electrode 14*a* is positioned on the left end (end positioned in the direction −X) in the lateral direction (direction X) of the mounting surface (referring to FIGS. 1 to 3, side surface positioned in the direction −Y of the two side surfaces parallel to the surface Z-X), whereas the p-side connecting electrode 14*b* is positioned on the right end (end positioned in the direction X) in the lateral direction of the mounting surface.

In order to prevent the leak of light from the light emitting device 100, it can be proposed that no semiconductor layer is provided at the outer periphery of the light emitting device 100. On the other hand, a structure with an electrode and the phosphor layer 22 directly coupled together might make it difficult to peel off a substrate. For this reason, a semiconductor layer can be formed over the entire surface under the n-side electrode 12*a* and the metal film 12*b*, thereby making it easy to peel off the substrate. However, this structure can expand cracks generated in the semiconductor layer in dividing process of the light emitted devices 100 formed on a wafer. In contrast, a structure in which the n-side electrode 12*a* and the metal film 12*b* are partly coupled to the semiconductor layer or phosphor layer can suppress the expansion of cracks, while making it easier to peel off the substrate. The reason for this is that although a crack may be generated in an electrode formation region (under the n-side electrode 12*a* and the metal film 12*b*), the semiconductor layers are separately formed to thereby prevent the expansion of the crack up to the semiconductor layer under the full-scale electrode 8, which does not adversely affect the characteristics of the light emitting device.

Thus, when producing the light emitting device 100, the n-side connecting electrode 14*a* of one of two adjacent light emitting devices 100 can be integrally formed with the p-side connecting electrode 14*b* of the other one of the adjacent light emitting devices. This arrangement can advantageously improve the productivity of the light emitting devices.

Note that the n-side connecting electrode 14a and the p-side connecting electrode 14b which are integrally formed can be separated from each other by dividing the light emitting devices 100 bonded together.

As shown in FIG. 1, in the arrangement according to the preferred embodiment, the n-side connecting electrode 14a and the p-side connecting electrode 14b are positioned at different lower-side corners (in the direction −Y) of the light emitting device 100 in the planar view from the upper surface side. That is, in the embodiment shown in FIG. 1, the n-side connecting electrode 14a is positioned at the left lower corner, whereas the p-side connecting electrode 14b is positioned at the right lower corner.

This means that as viewed from the upper surface in FIG. 1, generally, in order to ensure margins for cutting the periphery in dividing process and to facilitate removing a substrate for growth, the p-type semiconductor layer 6 and the n-type semiconductor layer 4 are formed not to extend up to the outer ends of the light emitting device, which suppress interference between parts where the p-type semiconductor layer 6 and the n-type semiconductor layer 4 can be arranged and parts where the n-side and p-side connecting electrodes 14a and 14b are disposed.

As a result, in the top view, this arrangement can place the p-type semiconductor layer 6 and n-type semiconductor layer 4 in a wider region as compared to the conventional light emitting device having the same area, and thus can advantageously emit a larger amount of light. In other words, the light emitting device of this embodiment can ensure the same amount of light as the conventional light emitting device even by using a smaller area (area viewed from the upper surface), which can reduce the size of the light emitting device.

The n-side connecting electrode 14a is electrically connected to the n-side electrode 12a.

In the embodiment shown in FIGS. 1 to 3, the n-side connecting electrode 14a is disposed in contact with the n-side electrode 12a.

Preferably, as shown in FIG. 2C, the n-side connecting electrode 14a is in contact with a part of the n-side electrode 12a extending over the phosphor layer 22 or substrate 2, and a part of the n-side electrode 12a extending over the upper surface of the n-type semiconductor layer 4 (the surface X-Y in FIGS. 1 to 3). Further, the n-side connecting electrode 14a is optionally in contact with a part of the n-side electrode 12a extending over the side surface of the n-type semiconductor layer 4 (the surface X-Z and/or Y-Z shown in FIGS. 1 to 3).

In this way, as shown in the top view of FIG. 1, the n-side connecting electrode 14a can be surely electrically connected to the n-side electrode 12a while the n-side connecting electrode 14a has a relatively small area in the top view.

The p-side connecting electrode 14b is electrically connected to the reflective film 16 via the metal wire 18. As mentioned above, the reflective film 16 is electrically connected to the p-type semiconductor layer 6, causing the p-side connecting electrode 14b to be electrically connected to the p-type semiconductor layer 6.

In the embodiments shown in FIGS. 1 to 3, the metal wire 18 has one end thereof wire-bonded to the upper surface of the reflective film 16 to form the bonding portion 58e, and the other end thereof wire-bonded to the upper surface of the p-side connecting electrode 14b to form the bonding portion 58b.

In the light emitting device 100, the metal wire may have wire bonding portions 58a, 58c and 58d not wire-bonded as shown in FIG. 1. This is because a production method of the light emitting device in one embodiment of the present invention can form the wire bonding portions 58a, 58c and 58d in an adjacent light emitting device to surely produce the bonding portion 58b in the desired form as mentioned in detail later.

The p-side connecting electrode 14b is preferably a bump, such as a plating bump formed by metal plating, so as to allow the metal wire 18 to be easily bonded to the electrode.

The n-side connecting electrode 14a is not connected to the metal wire, and thus does not need to have the form that facilitates wire bonding. However, as mentioned in detail in the following description of the production method in the one embodiment of the present invention, the p-side connecting electrode 14b of one of the two adjacent light emitting devices 100 is integrally formed with the n-side connecting electrode 14a of the other one and then these electrodes are separated from each other. In this case, when the p-side connecting electrode 14b is formed as the bump, such as the plating bump, the n-side connecting electrode 14a is also formed as a bump like the plating bump.

The plating bump mentioned above may be formed on the reflective film 16. Thus, the reflective effect can be enhanced.

Referring to FIGS. 1, 2C, and 2D, the p-side connecting electrode 14b may be disposed on a phosphor layer 22b via a metal film 12b. The metal film 12b is obtained in the production method to be mentioned in detail later. In short, the metal film 12b is provided by forming a metal film integrally with the n-side electrode 12a of another adjacent light emitting device 100, then integrally forming a p-side connecting electrode 14b and an n-side connecting electrode 14a for the another adjacent light emitting device 100 on the metal film, and thereafter dividing the light emitting devices 100.

Alternatively, by using another production method or the like, the p-side connecting electrode 14b may be disposed to be in contact with the upper surface of the phosphor layer 22 or substrate 2 without forming the metal film 12b.

The light emitting device 100 of this embodiment uses only one metal wire 18 mentioned above, as compared to the conventional light emitting device that needs a wire for electrically connecting a lead to an n-side electrode, and another wire for electrically connecting another lead to a p-side electrode. Therefore, the light emitting device 100 of this embodiment can be easily reduced in size.

The metal wire 18 may be any wire that is formed of any arbitrary metal, such as gold wire.

The light emitting device 100 shown in FIG. 1 preferably has its width in the longitudinal direction of 200 μm or more and 3 mm or less, and more preferably 600 μm or more and 2 mm or less. The light emitting device 100 shown in FIG. 1 preferably also has its width in the short side direction of 60 μm or more and 3 mm or less, and more preferably 150 μm or more and 2 mm or less.

The thickness (diameter) of the metal wire 18 shown in FIG. 1 is preferably 15 μm or more and 70 μm or less. The thickness (diameter) of the metal wire 18 is preferably 30 μm or more and 50 μm or less. As long as the lower limit of thickness (diameter) of the metal wire 18 is set within the above range, the metal wire can be prevented from being broken. In contrast, as long as the upper limit of thickness (diameter) of the metal wire 18 is set within the above range, a pad area corresponding to the size of a ball can be ensured.

The height of the light emitting device 100 shown in FIG. 2 can be 1,500 μm or less. The adjustment of thickness of the nitride semiconductor layer or phosphor layer can produce the side-view type light emitting device whose thickness is reduced to approximately 100 µm.

The semiconductor device 100 may not have on its lower surface, the substrate (growth substrate) 2 used for growing the n-type semiconductor layer 4 (and/or p-type semiconductor layer 6) as mentioned above. This is because, after forming the desired semiconductor layer, the substrate 2 may be removed as mentioned in detail below.

In order to obtain sufficient rigidity to the light emitting device 100 even without having the substrate 2, the resin layer 20 is formed to cover at least a part of each of the n-type semiconductor layer 4, p-type semiconductor layer 6, n-side connecting electrode 14a, n-side connecting electrode 14b and metal wire 18.

As shown in FIGS. 2 and 3, the resin layer 20 forms the upper surface (surface parallel to the surface X-Y as shown in FIGS. 1 to 3) and side surfaces (surfaces parallel to the surface Y-Z and other surfaces parallel to the surface Z-X as shown in FIGS. 1 to 3) of the light emitting device 100 (that is, the whole or a part of the side surface).

The resin layer 20 can be placed in the vicinity of the semiconductor layers after forming the semiconductor layers (p-type semiconductor layer 6 and n-type semiconductor layer 4), unlike the resin package of the conventional light emitting device that accommodates a semiconductor chip in a cavity provided in advance. This can reduce the size of the light emitting device. In particular, the thickness of the light emitting device (length in the direction Y shown in FIGS. 1 to 3) can be reduced, which can make the light emitting device thinner.

In the embodiment shown in FIGS. 1 to 3, the resin layer 20 is in contact with and covers the metal wire 18 and the reflective film 16 in the upper side thereof. The resin layer 20 is in contact with the outer peripheral part of the upper surface of the phosphor layer 22 or substrate 2 in the lower side thereof. The phosphor layer 20 is in contact with and partly covers the n-side connecting electrode 14a and p-side connecting electrode 14b. Further, the phosphor layer 20 covers the p-type semiconductor layer 6 and the n-type semiconductor layer 4 via the protective film 10, the full-scale electrode 8, the reflective film 16 and the like.

Note that in description of the structure of the light emitting device 100, the side of the phosphor layer 22 has been referred to as the bottom surface (downward), and the side of the reflective film 16 (or side of the resin layer 20 positioned above the reflective film 16) has been referred to as the upper surface (upward). This is because the n-type semiconductor layer 4, p-type semiconductor layer 6, full-scale electrode 8, protective film 10, reflective film 16, resin layer 20 and the like are formed over the substrate 2 from the bottom in that order when producing the light emitting device 100, as will be mentioned later.

On the other hand, when mounting the light emitting device 100, a mounting surface thereof is placed substantially in parallel to an upper surface of a mounting substrate. A wiring layer on the mounting surface is connected to each of the n-side and p-side connecting electrodes 14a and 14b with the mounting surface serving as a bottom surface and a surface opposite to the mounting surface serving as an upper surface (in the case of disposing the mounting surface on the lower surface side).

The details of respective elements of the light emitting device 100 will be described below.

p-Type Semiconductor Layer 6 and n-Type Semiconductor Layer 4

The p-type semiconductor layer 6 and the n-type semiconductor layer 4 may be formed of any kind of p-type semiconductor and n-type semiconductor, respectively, that can be used for any light emitting element (semiconductor chip), such as a light-emitting diode.

Preferable examples of the p-type semiconductor layer 6 and n-type semiconductor layer 4 can include nitride semiconductors that can form a blue LED and which are represented by the following chemical formula: $In_xAl_yGa_{1-X-Y}N$ ($0 \leq X$, $0 \leq Y$, $X+Y \leq 1$). In this case, the semiconductor chip 30 preferably includes a light emission layer (active layer) between the p-type semiconductor layer 6 and the n-type semiconductor layer 4. The light emission layer includes an InGaN layer or the like whose bandgap energy is smaller than that of the semiconductor layer.

The p-type semiconductor layer 6 and the n-type semiconductor layer 4 are not limited thereto. The p-type and n-type semiconductor layers may be formed of a layer containing any semiconductor used in a light emitting diode, for example, AlInGaP, AlGaAs, GaP and the like.

In the light emitting device 100 shown in FIG. 1, the n-type semiconductor layer 4 is formed on the phosphor layer 22, or growth substrate 2 which may be removed from the light emitting device finally obtained, and the p-type semiconductor layer 6 is formed thereon. The light emitting device 100, however, is not limited thereto. The light emitting device according to one embodiment of the present invention includes a light emitting device in which the p-type semiconductor layer is formed on the phosphor layer 22, or growth substrate 2 which may be removed from the light emitting device finally obtained, and the n-type semiconductor layer is formed thereon. That is, a light emitting device in which the p-type semiconductor layer and the n-type semiconductor layer are in reverse order with respect to the light emitting device 100.

Protective Film 10

The protective film 10 may be formed of any, material used for a light emitting device, for example, an oxide film or the like.

The protective film 10 may be a DBR film formed from multiple dielectric films, and thus can have the effect of reflection.

Full-Scale Electrode 8

The full-scale electrode 8 is formed to cover the substantially entire upper surface of the p-type semiconductor layer 6 to allow the current to uniformly flow through the p-type semiconductor layer 6. The full-scale electrode is very effective in being provided on the upper surface of a semiconductor, such as a nitride semiconductor for example, GaN or the like, that cannot easily flow the current uniformly. Suitable materials for the full-scale electrode can include, for example, a conductive oxide, such as ITO (indium tin oxide), IZO (indium zinc oxide), ZnO, $In_2O_3$ or $SnO_2$, and a metal thin film formed of Ag or the like. Among these materials, the ITO serving as a transparent electrode is preferably used.

Reflective Film 16

The reflective film 16 has electrical conductivity, and electrically connects the p-side electrode 12e to the metal wire 18. In addition, the reflective film 16 serves to reflect light which has been emitted and propagated from between the p-type semiconductor layer 6 and n-type semiconductor layer 4 upward (in the direction Z) through the full-scale electrode 8, protective film 10 and p-side electrode 12e, in the downward direction (in the direction −Z), for example, toward the phosphor layer 22 or substrate 2. Thus, the light emitting element 100 can improve its efficiency.

The reflective film 16 can be formed using a dielectric film or metal. Suitable metals for the reflective film 16 can include, for example, silver (Ag), gold (Au) and aluminum (Al). The reflective film 16 can be formed using a dielectric film or multiple metal films to improve the reflectivity. The multiple dielectric films can include, for example, multiple films of niobium oxide and silicon oxide, or of titanium oxide and silicon oxide. The DBR (Distributed Bragg Reflector) may be composed of at least three pairs of materials, and the upper limit of pairs of materials is not limited thereto. However, the upper limit of pairs of materials is approximately 40 pairs from the viewpoint of productivity of the light emitting device.

More preferably, a combination of the above-mentioned DBR and Al, or a combination of the above-mentioned DBR and Ag can be used. The combination of DBR and Ag has good reflectivity at any incident angle, so that the light emitting device can have the high reflectivity as a whole. The reflective film 16 formed of a combination of DBR and metal material uses a number of materials, whereby the light emitting device employing such multiple films can further increase its light extraction efficiency.

The reflective film 16 can also serve as the n-side electrode 12a or the metal film 12b.

In such a case, the reflective film 16 can be formed of, for example, Al/Ti/Au, ASC/Ti/Au, Al/Ni/Au, ASC/Ni/Au, or ASC/Ti/Pt/Au. Additionally, the reflective film 16 can also be formed of, for example, Ti/Al/Ti/Au, Ti/ASC/Ti/Au, Ti/Al/Ni/Au, Ti/ASC/Ni/Au or Ti/ASC/Ti/Pt/Au.

n-Side Electrode 12a, Metal Film 12b and p-Side Electrode 12e

The n-side electrode 12a, metal film 12b and p-side electrode 12e may be formed of any electrode material used in the n-type semiconductor layer 4 or p-type semiconductor layer.

Such electrode materials can include Ti, Cr, Ni, Au, Pt, Rh, W, Al and the like.

The n-side electrode 12a, metal film 12b and p-side electrode 12e can be omitted by using the reflective film mentioned above.

Resin Layer 20

The resin layer 20 may be formed of any kinds of resin. Preferable resins can include silicon resin and epoxy resin. The resin layer 20 is preferably formed of white resin. This is because such a resin layer 20 reflects a large amount of light having reached the resin layer 20.

p-Side Connecting Electrode 14b and n-Side Connecting Electrode 14a

The p-side connecting electrode 14b and n-side connecting electrode 14a may be formed of any material having electrical conductivity, such as metal. Preferably, the p-side connecting electrode 14b and n-side connecting electrode 14a are plating bumps formed of copper or a copper alloy. In addition, the p-side connecting electrode 14b and n-side connecting electrode 14a may be formed of Au plating or laminate plating. The laminate plating involves, for example, electrolytic plating of Cu followed by non-electrolytic plating of Ni/Au.

Substrate 2

The substrate 2 may be any substrate that can form the n-type semiconductor layer 4 (p-type semiconductor layer in some cases). The preferable substrate 2 can be, for example, a sapphire substrate, a silicon carbide substrate, a gallium nitride layer and the like. The semiconductor layer can be represented by a general chemical formula: $In_XAl_YGa_{1-X-Y}N$ ($0 \leq X$, $0 \leq Y$, $X+Y \leq 1$). The n-type semiconductor layer contains n-type impurities, whereas the p-type semiconductor layer contains p-type impurities.

Phosphor Layer 22

When the phosphor layer 22 is provided, the phosphor layer 22 may be a layer containing any phosphor that can be used in the light emitting device employing the light emitting diode.

When the p-type semiconductor layer 6 and the n-type semiconductor layer 4 are formed of a nitride semiconductor that can fabricate a blue LED and which is represented by the chemical formula of $In_XAl_YGa_{1-X-Y}N$ ($0 \leq X$, $0 \leq Y$, $X+Y \leq 1$) or the like, preferable phosphors can include, for example, at least one of element selected from the group consisting of an yttrium aluminum garnet (YAG) phosphor and a silicate phosphor, such as chlorosilicate phosphor, which emit green and/or yellow light, a SCASN phosphor, such as (Sr, Ca) $AlSiN_3$:Eu) and a CASN phosphor, such as $CaAlSiN_3$:Eu, which emit red light.

The operation of such a light emitting device 100 will be described below.

The light emitting device 100 is mounted on the mounting substrate in use as mentioned above. At this time, the n-side and p-side connecting electrodes 14a and 14b are electrically connected to different wirings on the mounting substrate. Thus, current flows through the p-side connecting electrode 14b, metal wire 18, reflective film 16, p-side electrode 12e and full-scale electrode 8 to enter the p-type semiconductor layer 6. The current flowed from the p-type semiconductor layer 6 to the n-type semiconductor layer 4 flows through the n-side electrode 12a and the n-side connecting electrode 14b, and then flows to the wiring of the mounting substrate.

In this way, the supply of the current allows the light having a desired wavelength to be emitted from between the p-type semiconductor layer 6 and the n-type semiconductor layer 4. A part of the emitted light is oriented directly downward (in the direction –Z of FIGS. 1 to 3), and another part of the emitted light is reflected by the resin layer 20 or reflective layer 16 to go downward. Then, the light is emitted from the light emitting device 100 to propagate in the direction substantially parallel to the mounting substrate.

When providing the phosphor layer 22, a part of the light incident on the phosphor layer 22 is absorbed by the phosphor inside the phosphor layer 22. The phosphor emits light having a longer wavelength than that of the absorbed light.

(2) Method for Producing Light Emitting Device 100

A method for producing the light emitting device 100 will be described below in the order of processes using FIGS. 4 to 13. The description below aims to exemplify the production method of the light emitting device 100, and does not intend to limit the production method of the light emitting device 100.

FIGS. 5 to 13 show the elements corresponding to one light emitting device 100. It is noted that FIGS. 5 to 13 illustrate only one light emitting device while a plurality of light emitting devices 100 are simultaneously formed on the wafer (substrate) 2 as shown in FIG. 4.

FIG. 4 shows a top view of a light emitting device assembly 200 including a plurality of light emitting devices 100 coupled together on the substrate 2. The illustration of the resin layer 20 is omitted from FIG. 4, like FIG. 1.

FIGS. 5A to 5D, 6E to 6H, and 7I to 7K are schematic cross-sectional views showing steps of forming the section IIa-IIa of FIG. 1. FIGS. 8A to 8D, 9E to 9H, and 10I to 10K are schematic cross-sectional views showing steps of forming the section IId-IId of FIG. 1. FIGS. 11A to 11D, 12E to 12H, and 13I to 13K are schematic cross-sectional views showing steps of forming the section IIIc-IIIc of FIG. 1.

Figure 5A:
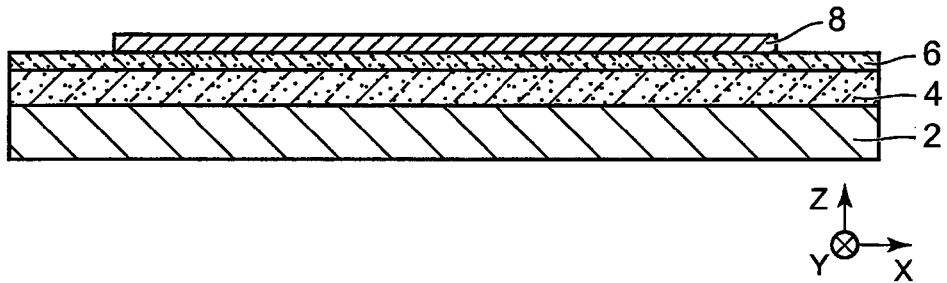
FIGS. 5A to 5D are schematic cross-sectional views showing steps of forming the section taken along line IIa-IIa of FIG. 1.

In FIGS. 5 to 13, the drawings with the same alphabet added to drawing numbers are the schematic cross-sectional views illustrating respective states obtained after the same step, as will be mentioned by "A" of the "FIG. 5A". As will be mentioned by the "A" of the "step A" below, the alphabet which is added to the "step" indicates a step corresponding to the drawing with the same alphabet added to the drawing number of each of FIGS. 5 to 13.

Step A

Figure 8A:
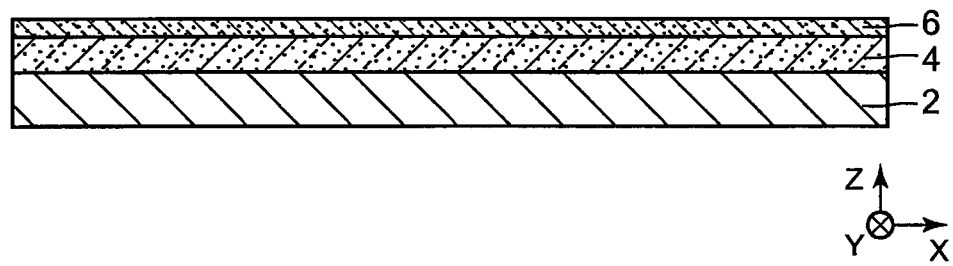
FIGS. 8A to 8D are schematic cross-sectional views showing steps of forming the section taken along line IId-IId of FIG. 1.
Figure 11A:
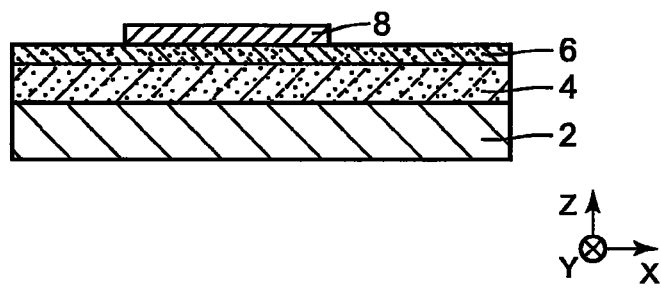
FIGS. 11A to 11D are schematic cross-sectional views showing steps of forming the section taken along line IIIc-IIIc of FIG. 1.

As shown in FIGS. 5A, 8A and 11A, after the n-type semiconductor layer 4 is formed on the substrate 2, and the p-type semiconductor layer 6 is formed on the n-type semiconductor layer 4, the full-scale electrode 8 is formed on the upper surface of the p-type semiconductor layer 6.

Step B

Figure 5B:
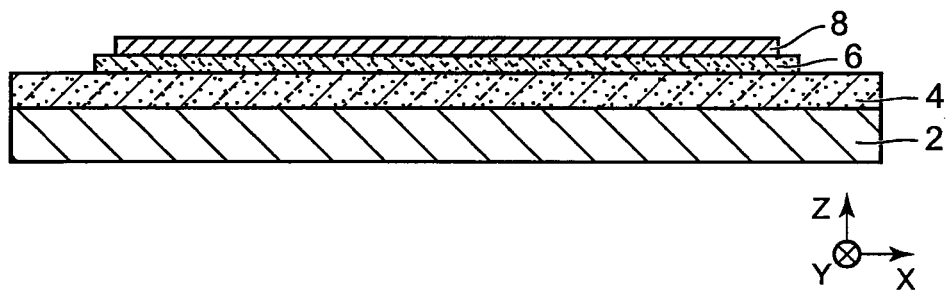
Figure 8B:
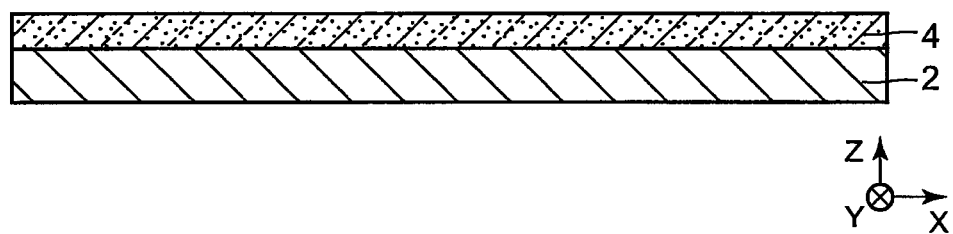
Figure 11B:
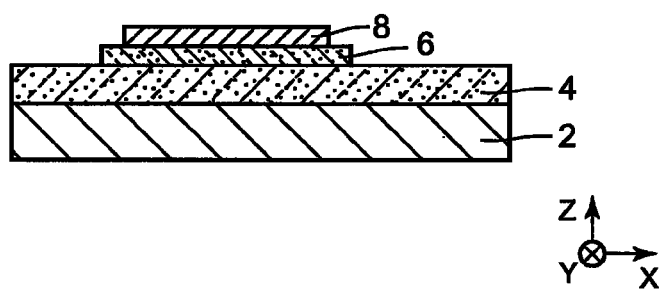

As shown in FIGS. 5B, 8B and 11B, an outer periphery of the p-type semiconductor layer 6 is removed by etching to expose an outer periphery of an upper surface of the n-type semiconductor layer 4.

Step C

Figure 5C:
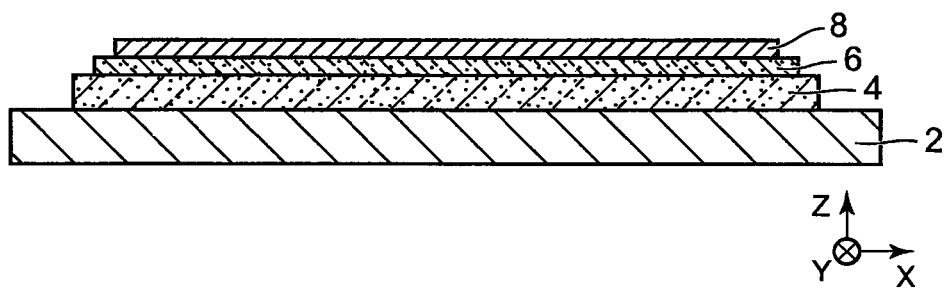
Figure 8C:
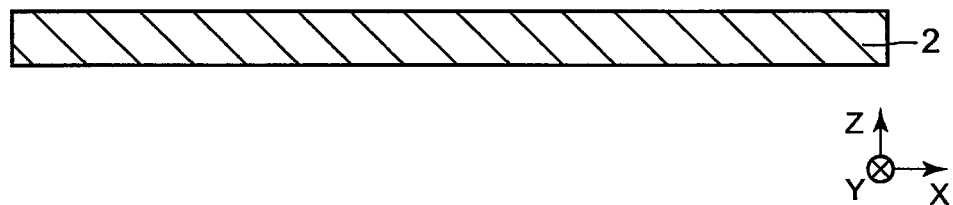
Figure 11C:
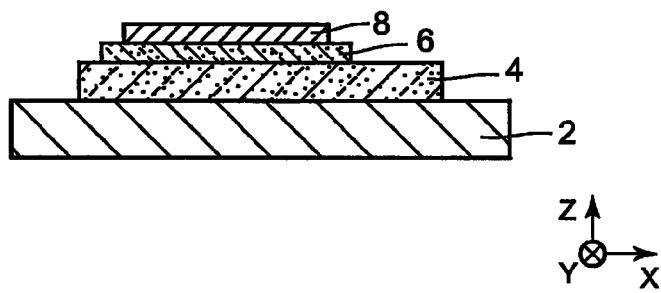

As shown in FIGS. 5C, 8C and 11C, an outer periphery of the n-type semiconductor layer 4 is removed by etching to expose the upper surface of the substrate 2 outside the outer periphery of the n-type semiconductor layer 4. As a result, for example, as shown in FIG. 5C, the outer periphery of the n-type semiconductor layer 4, the outer periphery of the p-type semiconductor layer 6, and the outer periphery of the full-scale electrode 8 have stepped portions.

Step D

Figure 5D:
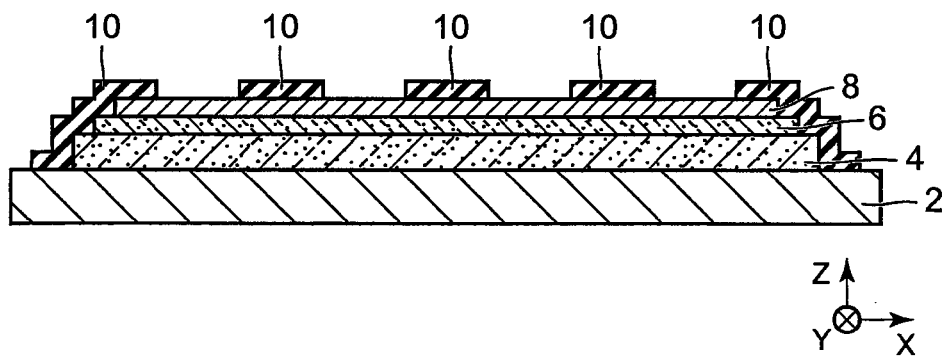
Figure 8D:
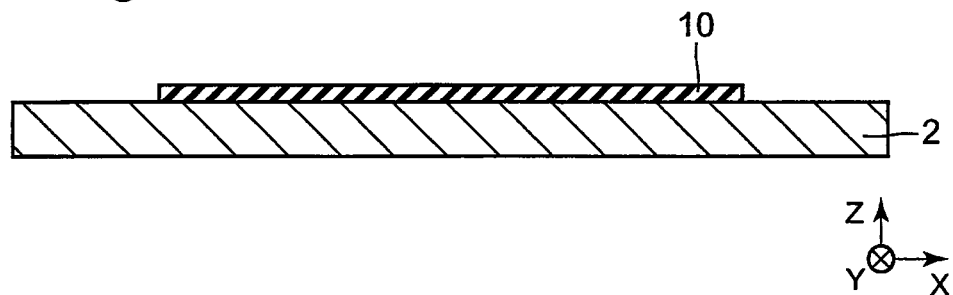
Figure 11D:
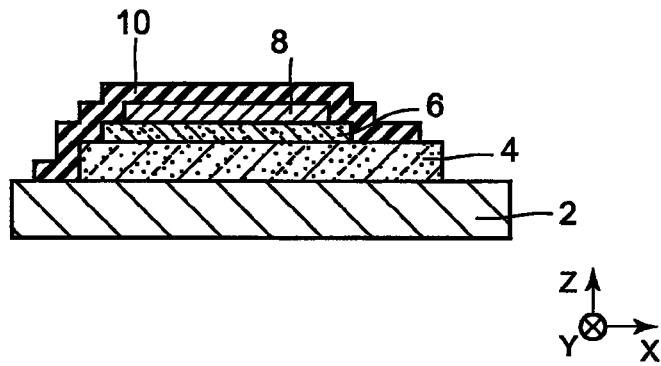

As shown in FIGS. 5D, 8D and 11D, the protective film 10 is formed on respective exposed parts of the substrate 2, n-type semiconductor layer 4, p-type semiconductor layer 6 and full-scale electrode 8.

No protective film 10 is formed on the outer periphery of the substrate 2, a part for forming the p-side electrode 12e of the upper surface of the full-scale electrode 8, and a part for forming the n-side electrode 12b of the upper surface and side surface of the n-type semiconductor layer 4.

Step E

Figure 6E:
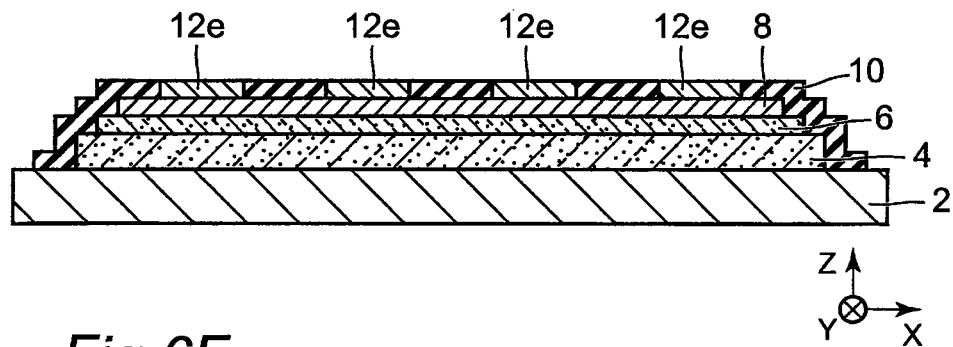
FIGS. 6E to 6H are schematic cross-sectional views showing steps of forming the section taken along line IIa-IIa of FIG. 1.
Figure 9E:
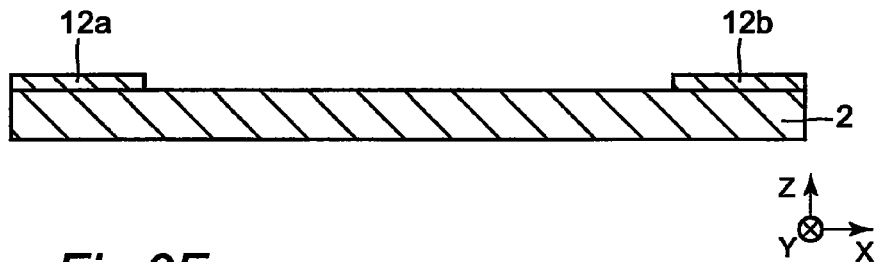
FIGS. 9E to 9H are schematic cross-sectional views showing steps of forming the section taken along line IId-IId of FIG. 1.
Figure 12E:
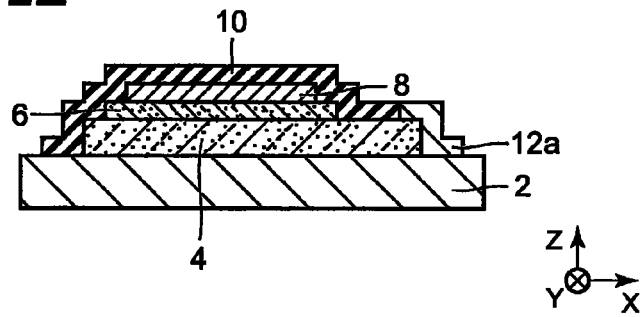
FIGS. 12E to 12H are schematic cross-sectional views showing steps of forming the section taken along line IIIc-IIIc of FIG. 1.

As shown in FIGS. 6E, 9E and 12E, the n-side electrode 12a, the metal film 12b and the p-side connecting electrode 12e are formed.

The formation of the electrode and metal film may be performed by forming a resist pattern by photolithography, sputtering using the pattern, then removing the resist pattern and a metal thin film formed thereon by liftoff, thereby leaving the metal thin film only in a desired position.

As shown in FIG. 4, the n-side electrode 12a of one of two adjacent light emitting devices 100 is preferably integrally formed with the metal film 12b of the other.

FIG. 4 shows a light emitting device assembly 200 including a plurality of light emitting devices 100 coupled together and arranged (or aligned) in an array. Although six light emitting devices 100, namely, light emitting devices 100A to 100F are arranged as shown in FIG. 4, this arrangement is illustrative only. The light emitting device assembly 200 may include the arbitrary number of light emitting devices 100, specifically, two or more light emitting devices 100.

Referring to FIG. 4, the n-side electrode 12a of the light emitting device 100D and the metal film 12b of the light emitting device 100C are integrally formed together as a metal film 12 (note that although other light emitting devices are integrally formed in the same way, now the light emitting devices 100C and 100D are taken as examples).

The metal film 12 is also formed in the light emitting device 100E as well as the light emitting device 100F so that the n-side electrode 12a and the metal film 12b are surely exposed from the mounting surface at the time of dividing process.

After the dividing process, the metal film 12 becomes a metal film 12c in the light emitting device 100E, and a metal film 12d in the light emitting device 100F.

In this way, the metal film 12 is formed integrally across the light emitting devices, which can form the n-side electrodes 12a and metal films 12b in a small area (in the planar view of FIG. 1) as compared to the case where the n-side electrode 12a and the metal film 12b are individually formed. Such a structure enlarges the light emission area to thereby improve the output. Additionally, the structure can also improve the productivity.

Step F

Figure 6F:
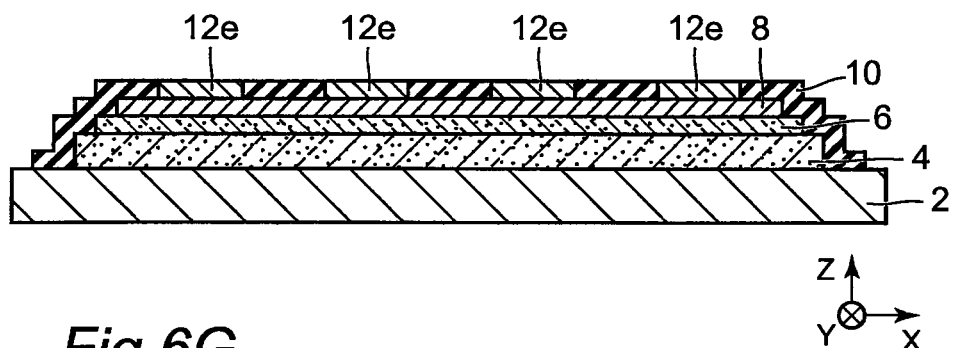
Figure 9F:
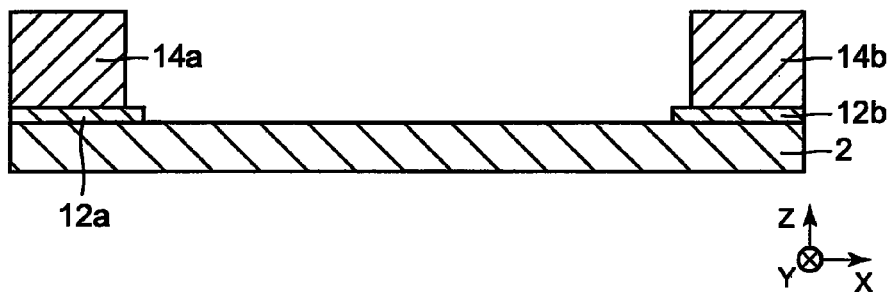
Figure 12F:
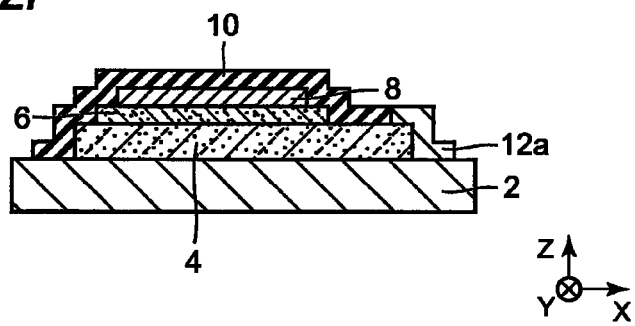

As shown in FIGS. 6F, 9F and 12F, the n-side connecting electrode 14a and the p-side connecting electrode 14a are formed.

These connecting electrodes 14a and 14b can be formed, for example, by plating.

As shown in FIG. 4, the n-side connecting electrode 14a of one of the two adjacent light emitting devices 100 is preferably integrally formed with the p-side connecting electrode 14b of the other.

Referring to FIG. 4, for example, the n-side connecting electrode 14a of the light emitting device 100D and the p-side connecting electrode 14b of the light emitting device 100C are integrally formed as a metal portion 14.

The metal portion 14 is also formed in the light emitting device 100E as well as the light emitting device 100F so that the n-side connecting electrode 14a and the p-side connecting electrode 14b are surely exposed from the mounting surface at the time of dividing process.

After the dividing process, the metal portion 14 becomes a metal portion 14c in the light emitting device 100E, and a metal portion 14d in the light emitting device 100F.

Further, in this way, the metal film 14 is formed integrally across the light emitting devices, which can form the n-side connecting electrode 14a and the p-side connecting electrode 14b in a small area (in the planar view of FIG. 1) as compared to the case where the n-side connecting electrode 14a and the p-side connecting electrode 14b are individually formed. Such a structure enlarges the light emission area to thereby improve the output. Further, the structure can also improve the productivity.

For example, in the dividing process, the metal portion 14 integrally formed in this way is cut into the n-side connecting electrode 14a and the p-side connecting electrode 14b, whereby the n-side and p-side connecting electrodes 14a and 14b are respectively exposed from another side surface adjacent to the mounting surface (the n-side connecting electrode 14a is exposed from the side surface (second side surface) on a side in the direction −X of two side surfaces parallel to the surface Y-Z shown in FIGS. 1 to 3, whereas the p-side connecting electrode 14b is exposed from the side surface (third side surface) on a side in the direction X of two side surfaces parallel to the surface Y-Z shown in FIGS. 1 to 3).

When mounting the light emitting device 100 on the mounting substrate, the part of the n-side connecting electrode 14a exposed from the second side surface and the part of the p-side connecting electrode 14b exposed from the third side surface can be soldered to surely electrically connect the light emitting device 100 to the wirings on the mounting substrate.

Step G

Figure 6G:
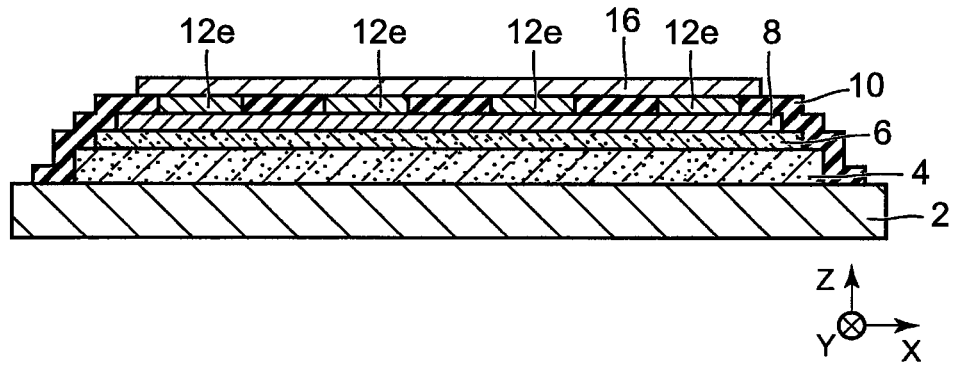
Figure 9G:
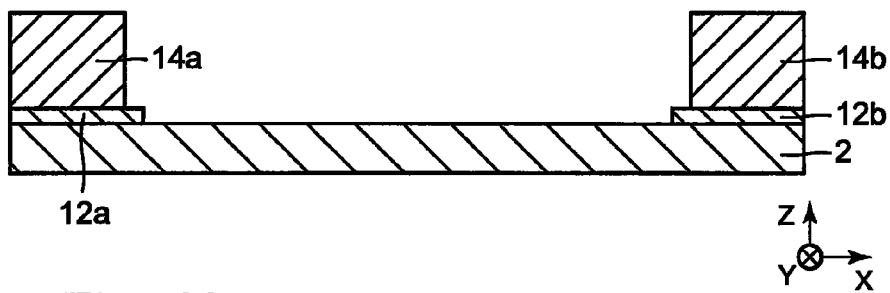
Figure 12G:
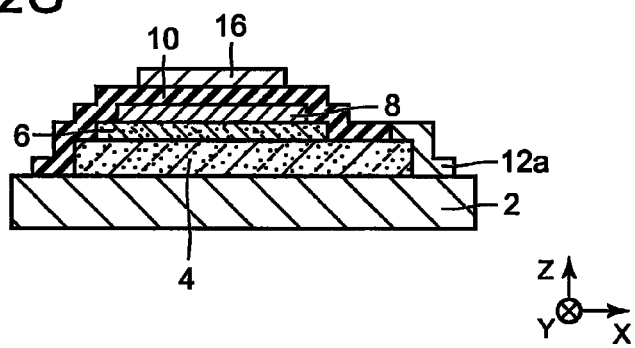

As shown in FIGS. 6G, 9G and 12G, the reflective film 16 is formed on the upper surface of the protective film 10 and the upper surface of the p-side electrode.

The reflective film 16 can be formed, for example, by sputtering or the like.

Step H

Figure 6H:
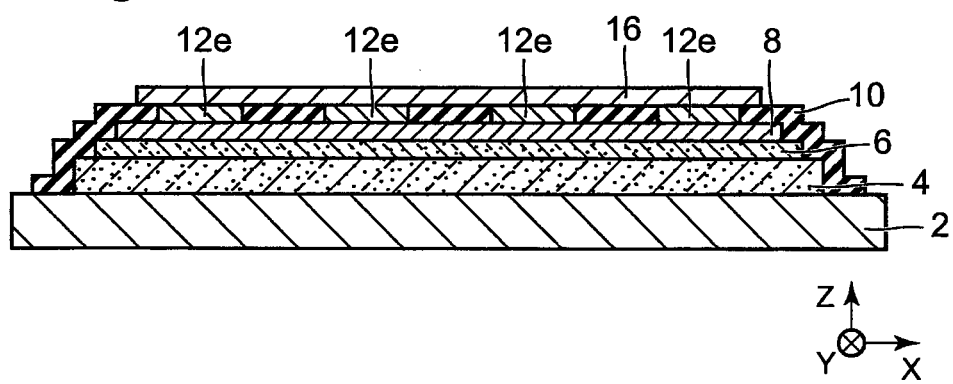
Figure 9H:
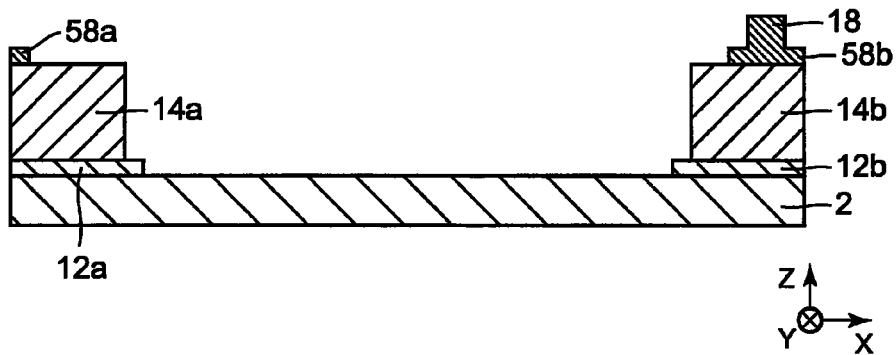
Figure 12H:
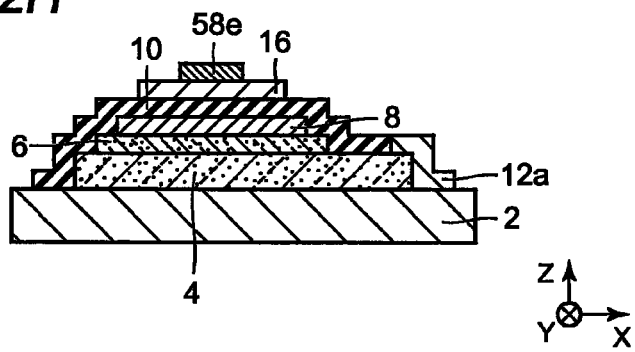

As shown in FIGS. 6H, 9H and 12H, the p-side connecting electrode 14b and the reflective film 16 are connected together by the metal wire 18. Preferably, one end of the metal wire 18 is wire-bonded to the upper surface of the p-side connecting electrode 14b (to form the wire bonding portion 58b), whereas the other end of the metal wire 18 is wire-bonded to the upper surface of the reflective film 16 (to form the wire bonding portion 58e).

As shown in FIGS. 1 and 9H, the wire bonding portion 58 may be formed up to another adjacent light emitting device 100 so that the wire bonding 58b is surely formed up to the end (end in the direction X and the end in the direction -Y as shown in FIGS. 1 and 9H). When dividing the substrate into individual light emitting devices, the wire bonding portion 58b may be finally obtained.

That is, the light emitting device 1000 shown in FIG. 4 will be described below by way of example. In order to form the wire bonding portion 58b of the light emitting device 100C, one wire bonding portion 58 is formed across three adjacent light emitting devices 100D, 100E and 100F, in addition to the light emitting device 100C. When the substrate into the light emitting devices 100C, 100D, 100E and 100F are singulated in the following dividing step, the wire bonding portion 58b is formed in the light emitting device 100C. On the other hand, the bonding portion 58a is formed in the light emitting device 100D, the bonding portion 58c is formed in the light emitting device 100E, and the bonding portion 58d is formed in the light emitting device 100F.

In the embodiment shown in FIG. 4, the bonding portions 58a, 58c and 58d are not bonded to the metal wire. However, the bonding portions 58a, 58c and 58d can be formed, thereby obtaining the wire bonding 58b in a desired form in another adjacent light emitting device.

Step I

Figure 7I:
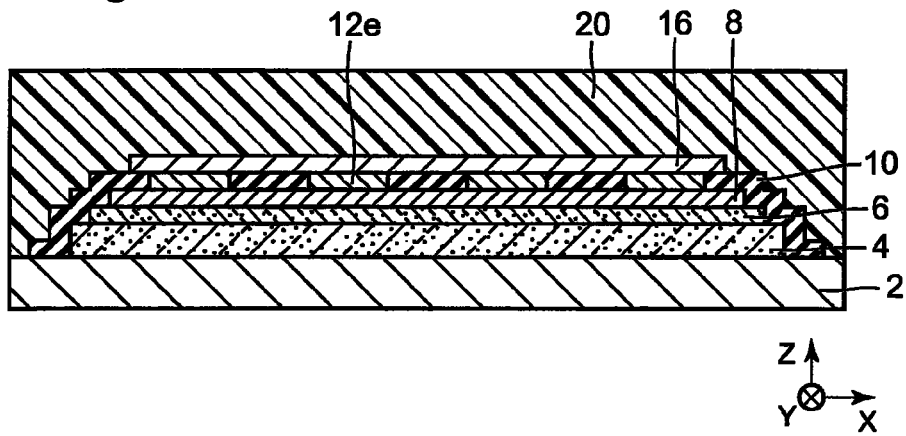
FIGS. 7I to 7K are schematic cross-sectional views showing steps of forming the section taken along line IIa-IIa of FIG. 1.
Figure 10I:
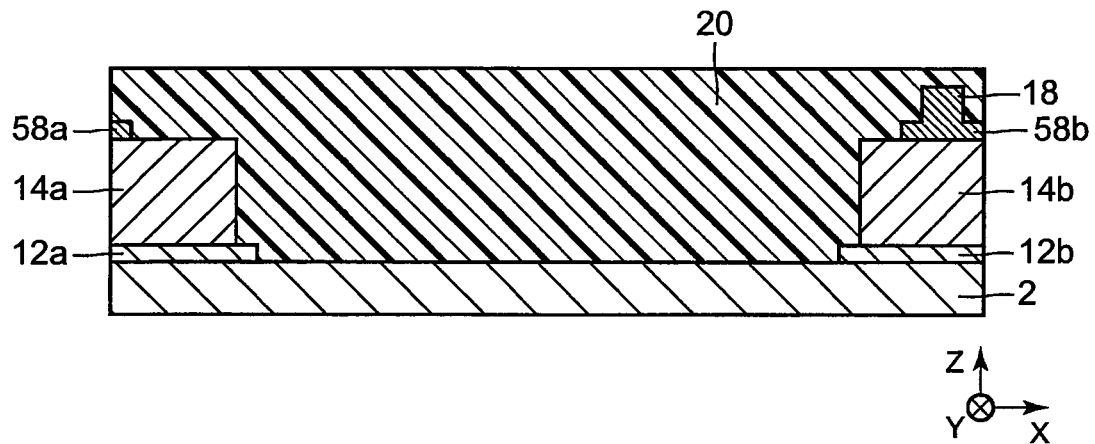
FIGS. 10I to 10K are schematic cross-sectional views showing steps of forming the section taken along line IId-IId of FIG. 1.
Figure 13I:
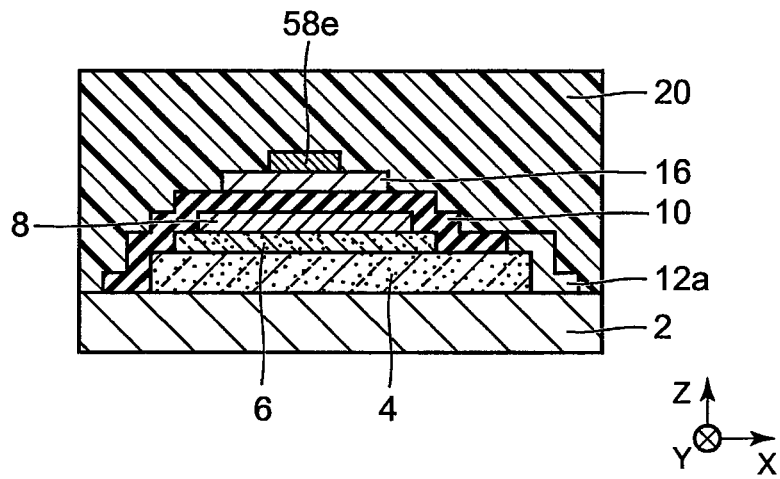
FIGS. 13I to 13K are schematic cross-sectional views showing steps of forming the section taken along line IIIc-IIIc of FIG. 1.

As shown in FIGS. 7I, 10I and 13I, the resin layer 20 is formed. The resin layer 20 can be formed by placing in the die, the substrate 2 (in the state shown in FIG. 4) with the members for the light emitting devices 100 formed thereover via the above steps A to H, and performing compression molding on the substrate.

In this state, if the dividing process to be mentioned later is performed, the light emitting device 100 with the substrate 2 located as the bottom surface can be obtained.

Before the dividing process, the following step J or the combination of the steps J and K may be performed.

Step J

Figure 7J:
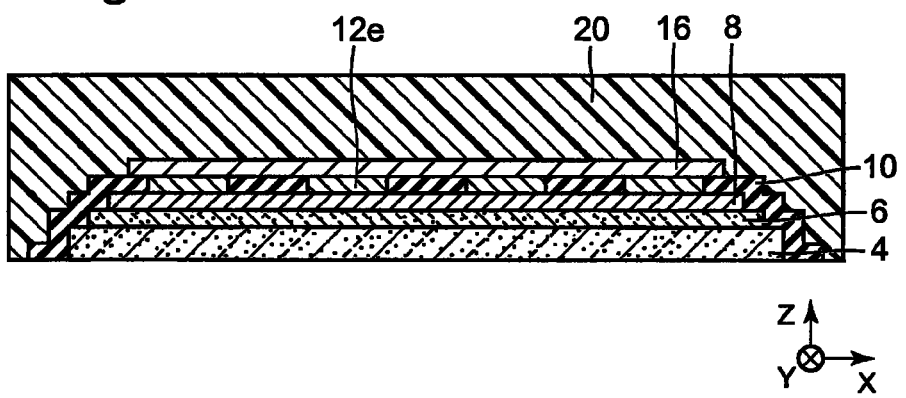
Figure 10J:
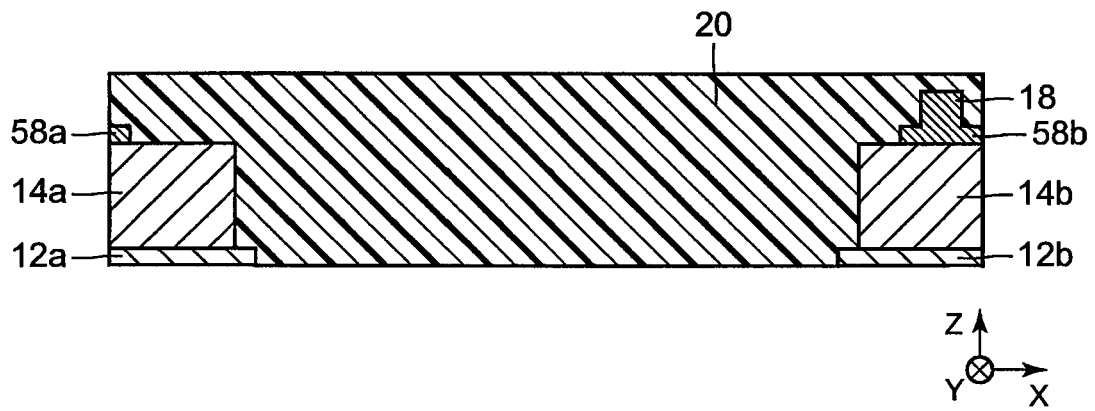
Figure 13J:
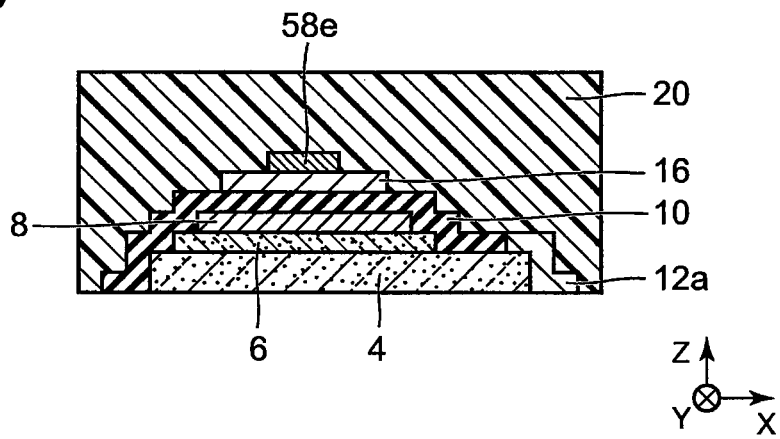

The substrate 2 is removed as shown in FIGS. 7J, 10J and 13J.

The substrate 2 may be completely removed. The removal of the substrate 2 can be performed, for example, by a laser lift-off (LLO) method.

In this state, the singulation may be performed to obtain the light emitting device 100.

Step K

Figure 7K:
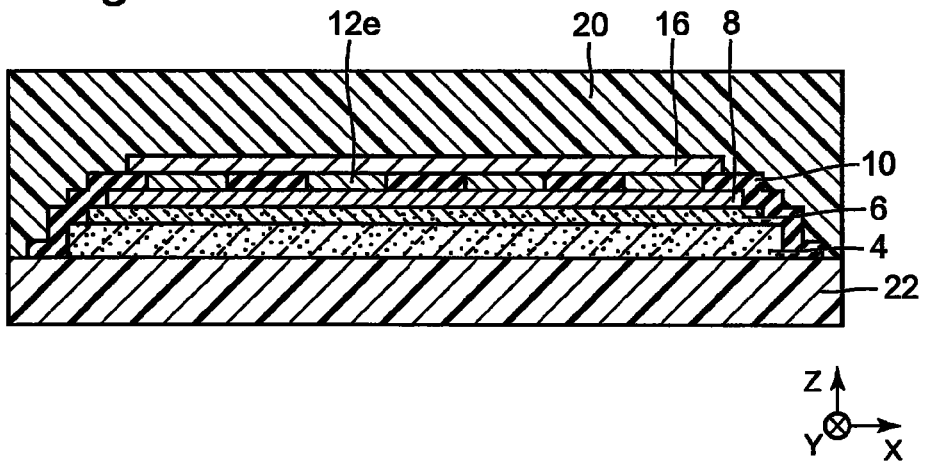
Figure 10K:
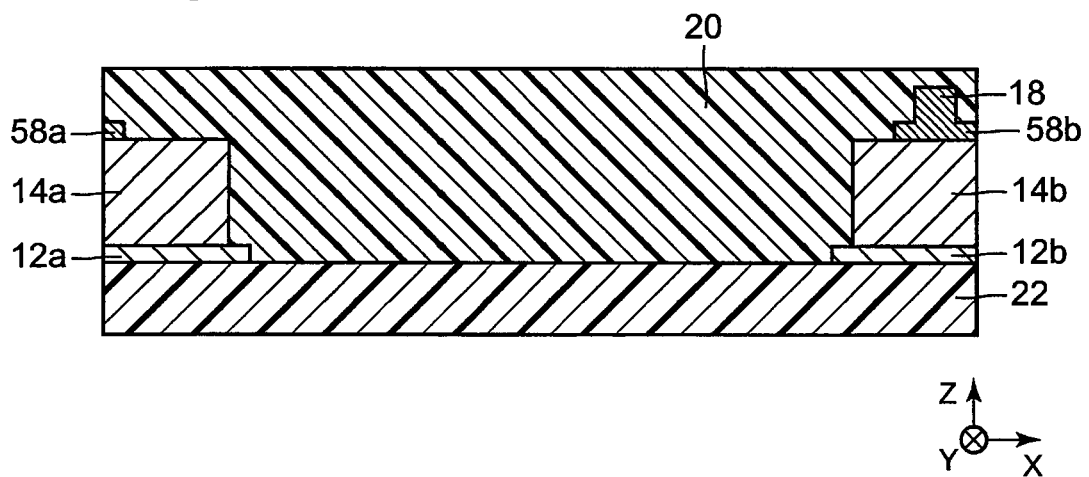
Figure 13K:
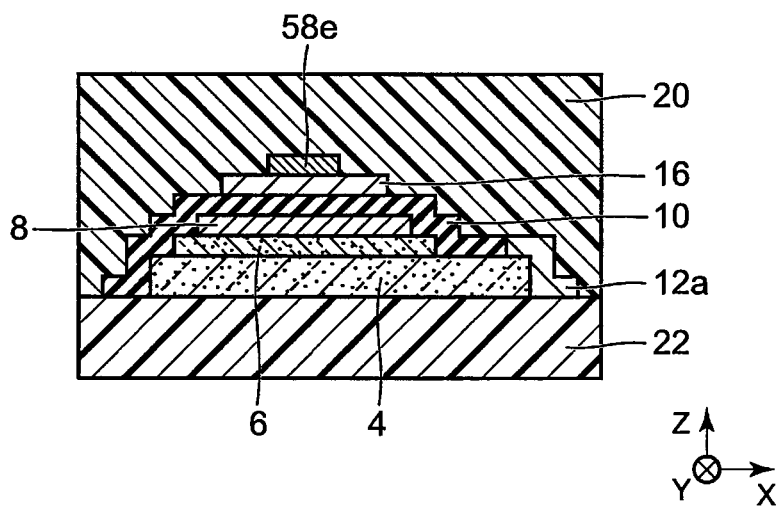

As shown in FIGS. 7K, 10K and 13K, the phosphor layer 22 is provided.

After removing the substrate 2, the lower surface of the n-type semiconductor layer 4 is preferably roughened before forming the phosphor layer 22. The roughening can be performed, for example, by wet etching.

The resin containing the phosphor is compression-molded into a phosphor layer 22 on the lower surface of the n-type semiconductor layer 4.

The light emitting device assembly 200 formed in this way is singulated by a die into pieces (separated into the individual light emitting devices), so that the light emitting device 100 can be obtained.

DESCRIPTION OF REFERENCE NUMERALS

2 Substrate
4 n-type semiconductor layer
6 p-type semiconductor layer
8 Full-scale electrode
10 Protective film
12, 12b, 12c, 12d Metal film
12a n-side electrode
12e p-side electrode
14, 14c, 14d Metal portion
14a n-side connecting electrode
14b p-side connecting electrode
16 Reflective film
18 Metal wire
20 Resin layer
22 Phosphor layer
100, 100A, 100B, 100C, 100D, 100E, 100F Light emitting device
200 Light emitting device assembly

What is claimed is:

1. A side-view type light emitting device having a bottom surface thereof as a light emission surface and a first lateral surface thereof as a mounting surface for mounting on a mounting substrate, the light emitting device comprising:
   a stacked semiconductor layer including a first semiconductor layer, an active layer and a second semiconductor layer, the first semiconductor layer, the active layer and the second semiconductor layer being stacked in that order from a side of the bottom surface;
   a first connecting electrode exposed from the first lateral surface and electrically connected to the first semiconductor layer;
   a metal wire having one end thereof electrically connected to an upper surface of the second semiconductor layer;
   a second connecting electrode exposed from the first lateral surface and electrically connected to the other end of the metal wire, wherein at least a portion of the second connecting electrode and at least a portion of the second semiconductor layer are in a same laterally extending plane, and the second connecting electrode is on laterally outer side of the second semiconductor layer; and
   a resin layer covering at least a part of each of the first semiconductor layer, the second semiconductor layer, the first connecting electrode, the second connecting electrode and the metal wire, the resin layer being configured to form an upper surface and lateral surfaces of the light emitting device,
   wherein, in a direction perpendicular to the light emission surface, the active layer does not overlap with the first connecting electrode, and the active layer does not overlap with the second connecting electrode.

2. The light emitting device according to claim 1, wherein the first connecting electrode and the second connecting electrode are positioned at different ends in a lateral direction of the mounting surface.

3. The light emitting device according to claim 1, wherein the first connecting electrode covers a part of an upper surface of the first semiconductor layer to be electrically connected to the first semiconductor layer.

4. The light emitting device according to claim 1, further comprising a phosphor layer containing phosphor at the bottom surface.

5. The light emitting device according to claim 1, wherein the first connecting electrode is exposed from a second lateral surface of the light emitting device, the second lateral surface being different from the mounting surface, and wherein the second connecting electrode is exposed from a third lateral surface of the light emitting device, the third lateral surface being different from the mounting surface and the second lateral surface.

6. A method for producing the light emitting device according to claim 1 by forming a light emitting device assembly with a plurality of light emitting devices arranged on a substrate and coupled together, and dividing the light emitting device assembly into the individual light emitting devices, the method comprising integrally forming the first connecting electrode in one of two adjacent light emitting devices of the light emitting device assembly, with the second connecting electrode in the other one of the two adjacent light emitting devices.

7. The method for producing the light emitting device according to claim 6, wherein the first connecting electrode and the second connecting electrode to be integrally formed together are formed by a plating method.

8. The light emitting device according to claim 1, wherein a diameter of the metal wire is 15 μm or more and 70 μm or less.

9. The method for producing the light emitting device according to claim 6, wherein the metal wire includes a bonding portion at one end thereof formed by using a wire-bonding step.

10. The method for producing the light emitting device according to claim 6, wherein in the integrally forming the first connecting electrode, the first connecting electrode in the one of the two adjacent light emitting devices is in contact with the second connecting electrode in the other one of the two adjacent light emitting devices.

11. A side-view type light emitting device having a bottom surface thereof as a light emission surface and a first lateral surface thereof as a mounting surface for mounting on a mounting substrate, the light emitting device comprising:
- a stacked semiconductor layer including a first semiconductor layer, an active layer and a second semiconductor layer, the first semiconductor layer, the active layer and the second semiconductor layer being stacked in that order from a side of the bottom surface;
- a first connecting electrode exposed from the first lateral surface and electrically connected to the first semiconductor layer;
- a reflective film electrically connected to the second semiconductor layer;
- a second connecting electrode exposed from the first lateral surface, wherein at least a portion of the second connecting electrode and at least a portion of the second semiconductor layer are in a same laterally extending plane, and the second connecting electrode is on laterally outer side of the second semiconductor layer;
- a conductive member extending from the reflective film to the second connecting electrode, the second connecting electrode being electrically connected to an end of the conductive member; and
- a resin layer covering at least a part of each of the first semiconductor layer, the second semiconductor layer, the first connecting electrode, the second connecting electrode and the conductive member, the resin layer being configured to form an upper surface and lateral surfaces of the light emitting device,
- wherein, in a direction perpendicular to the light emission surface, the active layer does not overlap with the first connecting electrode, and the active layer does not overlap with the second connecting electrode.

* * * * *